United States Patent
Mehdi et al.

(10) Patent No.: US 11,156,325 B2
(45) Date of Patent: Oct. 26, 2021

(54) STAND ASSEMBLY FOR AN ELECTRONIC DEVICE PROVIDING MULTIPLE DEGREES OF FREEDOM AND BUILT-IN CABLES

(71) Applicant: GOOGLE INC., Mountain View, CA (US)

(72) Inventors: Rafat E. Mehdi, Palo Alto, CA (US); Adam Scott Kilgore, San Rafael, CA (US); Jason Evans Goulden, Los Gatos, CA (US)

(73) Assignee: Google LLC, Mountain View, CA (US)

( * ) Notice: Subject to any disclaimer, the term of this patent is extended or adjusted under 35 U.S.C. 154(b) by 118 days.

(21) Appl. No.: 16/459,704

(22) Filed: Jul. 2, 2019

(65) Prior Publication Data

US 2019/0323651 A1 Oct. 24, 2019

Related U.S. Application Data

(63) Continuation of application No. 15/606,888, filed on May 26, 2017, now Pat. No. 10,352,496.
(Continued)

(51) Int. Cl.
*F16M 11/10* (2006.01)
*F16M 13/02* (2006.01)
(Continued)

(52) U.S. Cl.
CPC ....... *F16M 11/2035* (2013.01); *F16M 11/105* (2013.01); *F16M 11/14* (2013.01);
(Continued)

(58) Field of Classification Search
CPC ............... F16M 11/041; F16M 11/105; F16M 11/2064; F16M 11/38; F16M 11/02;
(Continued)

(56) References Cited

U.S. PATENT DOCUMENTS 1,483,588 A 2/1924 Myers et al.
1,945,956 A 10/1932 Rowell
(Continued)

FOREIGN PATENT DOCUMENTS

CN 201203743 3/2009
CN 201657126 11/2010
(Continued)

OTHER PUBLICATIONS

"Advisory Action", U.S. Appl. No. 15/608,904, filed May 18, 2020, 3 pages.
(Continued)

*Primary Examiner* — Tan Le
(74) *Attorney, Agent, or Firm* — Colby Nipper PLLC

(57) ABSTRACT

A stand assembly for an electronic device includes a neck portion with a first end that holds and extends from the electronic device, a spine portion that is coupled via a joint structure to a second end of the neck portion, the joint structure being configured to provide a first rotational degree of freedom of the neck portion with respect to the spine portion, and one or more interconnect wires. The one or more interconnect wires include a first wire portion, a second wire portion and a third wire portion, the first wire portion being routed through an interior of the neck portion, the second wire portion being routed along a surface of the spine portion, and the third wire portion being routed though the joint structure from the surface of the spine portion to the interior of the neck portion.

21 Claims, 18 Drawing Sheets

Related U.S. Application Data

(60) Provisional application No. 62/511,302, filed on May 25, 2017.

(51) Int. Cl.

| | | |
|---|---|---|
| *G03B 17/55* | (2021.01) | |
| *H04N 5/225* | (2006.01) | |
| *F16M 11/04* | (2006.01) | |
| *F16M 11/06* | (2006.01) | |
| *A47B 97/00* | (2006.01) | |
| *F16M 11/20* | (2006.01) | |
| *F16M 13/00* | (2006.01) | |
| *F16M 11/14* | (2006.01) | |
| *G03B 17/08* | (2021.01) | |
| *H04N 7/18* | (2006.01) | |
| *H05K 7/20* | (2006.01) | |
| *G03B 17/56* | (2021.01) | |
| *F21V 21/30* | (2006.01) | |
| *F21V 21/088* | (2006.01) | |
| *F16M 11/38* | (2006.01) | |

(52) U.S. Cl.
CPC .......... *F16M 13/00* (2013.01); *F16M 13/005* (2013.01); *F16M 13/02* (2013.01); *F16M 13/022* (2013.01); *G03B 17/08* (2013.01); *G03B 17/55* (2013.01); *H04N 5/2252* (2013.01); *H04N 7/181* (2013.01); *H05K 7/20445* (2013.01); *A47B 2097/003* (2013.01); *F16M 11/041* (2013.01); *F16M 11/06* (2013.01); *F16M 11/2007* (2013.01); *F16M 11/2064* (2013.01); *F16M 11/38* (2013.01); *F21V 21/088* (2013.01); *F21V 21/30* (2013.01); *G03B 17/561* (2013.01); *H04N 5/2254* (2013.01)

(58) Field of Classification Search
CPC ........... F16M 11/022; F16M 2200/022; F16M 13/02; F16M 11/2035; F21V 21/088; F21V 21/30; B25J 18/02; B25J 19/04
See application file for complete search history.

(56) References Cited

U.S. PATENT DOCUMENTS

| | | | |
|---|---|---|---|
| 2,645,511 A | 7/1953 | Rutledge | |
| 2,734,997 A | 2/1956 | Frady | |
| 3,733,042 A | 5/1973 | Jungjohann et al. | |
| 3,748,383 A | 7/1973 | Grossman | |
| 4,904,148 A * | 2/1990 | Larsson | B25J 9/04 |
| | | | 414/680 |
| 5,437,207 A * | 8/1995 | Zimmer | B23K 11/318 |
| | | | 414/918 |
| 5,464,178 A | 11/1995 | Grinwald et al. | |
| 5,497,306 A | 3/1996 | Pastrick | |
| 5,508,740 A | 4/1996 | Miyaguchi et al. | |
| 5,625,410 A | 4/1997 | Washino et al. | |
| 5,765,485 A | 6/1998 | Thoman et al. | |
| D403,313 S | 12/1998 | Peppel | |
| 6,018,414 A | 1/2000 | Chipper | |
| 6,020,994 A | 2/2000 | Cook | |
| D424,036 S | 5/2000 | Arora et al. | |
| 6,250,174 B1 * | 6/2001 | Terada | B25J 9/047 |
| | | | 414/918 |
| D456,293 S | 4/2002 | Tsumura et al. | |
| 6,585,201 B1 | 7/2003 | Reed | |
| 6,593,956 B1 | 7/2003 | Lee et al. | |
| D488,818 S | 4/2004 | Lee et al. | |
| D500,047 S | 12/2004 | Sevedermish | |
| 6,948,131 B1 | 9/2005 | Neven et al. | |
| 6,954,498 B1 | 10/2005 | Lipton | |
| D550,227 S | 9/2007 | Sato et al. | |
| 7,382,244 B1 | 6/2008 | Donovan et al. | |
| D590,416 S | 4/2009 | Kochackis | |
| D597,864 S | 8/2009 | Sakuma et al. | |
| D607,004 S | 12/2009 | Kordus et al. | |
| D619,612 S | 7/2010 | Pueyo et al. | |
| D621,730 S | 8/2010 | Driver et al. | |
| D626,131 S | 10/2010 | Kruzeniski et al. | |
| 7,877,708 B2 | 1/2011 | Zinn et al. | |
| 7,884,855 B2 | 2/2011 | Ortiz | |
| 7,903,115 B2 | 3/2011 | Platzer et al. | |
| 7,996,771 B2 | 8/2011 | Girgensohn | |
| D647,809 S | 11/2011 | Driver | |
| D656,157 S | 3/2012 | Khan et al. | |
| D658,674 S | 5/2012 | Shallcross et al. | |
| 8,184,069 B1 | 5/2012 | Rhodes | |
| 8,188,432 B1 | 5/2012 | Nguyen et al. | |
| D661,701 S | 6/2012 | Brown et al. | |
| D662,508 S | 6/2012 | Kim | |
| D664,966 S | 8/2012 | Shallcross et al. | |
| D664,978 S | 8/2012 | Tanghe et al. | |
| D672,364 S | 12/2012 | Reyna et al. | |
| 8,340,654 B2 | 12/2012 | Bratton et al. | |
| D677,269 S | 3/2013 | Scott et al. | |
| D678,898 S | 3/2013 | Walsh et al. | |
| 8,390,684 B2 | 3/2013 | Piran et al. | |
| D681,653 S | 5/2013 | Bitran et al. | |
| D681,660 S | 5/2013 | Matas | |
| D684,164 S | 6/2013 | Friedlander et al. | |
| D686,221 S | 7/2013 | Brinda et al. | |
| D686,635 S | 7/2013 | Cranfill et al. | |
| D689,892 S | 9/2013 | Perry et al. | |
| D689,895 S | 9/2013 | DeLuca | |
| D692,450 S | 10/2013 | Convay et al. | |
| D694,255 S | 11/2013 | Jones, Jr. | |
| 8,589,374 B2 | 11/2013 | Chaudhri | |
| D696,677 S | 12/2013 | Corcoran et al. | |
| 8,615,511 B2 | 12/2013 | Jones | |
| D697,930 S | 1/2014 | Crabtree et al. | |
| D697,940 S | 1/2014 | Bitran et al. | |
| 8,665,375 B2 | 3/2014 | Moore et al. | |
| D702,700 S | 4/2014 | Thomspon | |
| D702,704 S | 4/2014 | Santos et al. | |
| D705,255 S | 5/2014 | Gerssen et al. | |
| 8,720,296 B2 * | 5/2014 | Yonehara | B25J 9/046 |
| | | | 74/490.02 |
| D707,245 S | 6/2014 | Bruck et al. | |
| D708,197 S | 7/2014 | Pasceri et al. | |
| D708,204 S | 7/2014 | Pasceri et al. | |
| D711,415 S | 8/2014 | Simister et al. | |
| D712,928 S | 9/2014 | Brener et al. | |
| D714,334 S | 9/2014 | Cojuangco et al. | |
| 8,830,193 B2 | 9/2014 | Shah | |
| 8,843,239 B2 | 9/2014 | Migdoll et al. | |
| D715,835 S | 10/2014 | Montgomery et al. | |
| D716,334 S | 10/2014 | Lee et al. | |
| D717,809 S | 11/2014 | Tsuru et al. | |
| D717,823 S | 11/2014 | Brotman et al. | |
| 8,917,274 B2 | 12/2014 | Ma et al. | |
| D720,765 S | 1/2015 | Xie et al. | |
| D720,766 S | 1/2015 | Mandal et al. | |
| D721,382 S | 1/2015 | Brinda et al. | |
| D723,576 S | 3/2015 | Jones | |
| D724,603 S | 3/2015 | Williams et al. | |
| D725,666 S | 3/2015 | Tseng et al. | |
| 8,984,436 B1 | 3/2015 | Tseng et al. | |
| 8,988,232 B1 | 3/2015 | Sloo et al. | |
| D726,735 S | 4/2015 | Asai | |
| D727,336 S | 4/2015 | Allison et al. | |
| D727,928 S | 4/2015 | Allison et al. | |
| D736,223 S | 8/2015 | Park | |
| D736,792 S | 8/2015 | Brinda et al. | |
| D737,131 S | 8/2015 | Frandsen | |
| D737,278 S | 8/2015 | Shin et al. | |
| D737,283 S | 8/2015 | Scalisi | |
| D739,429 S | 9/2015 | Veilleux et al. | |
| D739,864 S | 9/2015 | Kang | |
| 9,140,572 B2 | 9/2015 | Millington | |
| D740,300 S | 10/2015 | Lee et al. | |
| 9,158,974 B1 | 10/2015 | Laska et al. | |

(56) References Cited

U.S. PATENT DOCUMENTS

| | | |
|---|---|---|
| 9,170,707 B1 | 10/2015 | Laska et al. |
| D745,527 S | 12/2015 | Wang |
| 9,216,479 B2 * | 12/2015 | Takahashi ............... B25J 18/02 |
| D746,828 S | 1/2016 | Arai et al. |
| D746,849 S | 1/2016 | Anzures et al. |
| D747,333 S | 1/2016 | Supino et al. |
| 9,235,899 B1 | 1/2016 | Kirmani et al. |
| D748,666 S | 2/2016 | Heeter et al. |
| D749,620 S | 2/2016 | Jones |
| D751,090 S | 3/2016 | Hu et al. |
| D752,061 S | 3/2016 | Ahn et al. |
| D752,072 S | 3/2016 | Song |
| D752,107 S | 3/2016 | Yun |
| D752,605 S | 3/2016 | Wang et al. |
| D753,132 S | 4/2016 | Cuthbert et al. |
| D753,151 S | 4/2016 | Lee et al. |
| D753,703 S | 4/2016 | Villamor et al. |
| D753,708 S | 4/2016 | Yang et al. |
| D754,713 S | 4/2016 | Zhang et al. |
| D754,714 S | 4/2016 | Zhang et al. |
| D755,193 S | 5/2016 | Sun et al. |
| D756,379 S | 5/2016 | Apodaca et al. |
| D756,401 S | 5/2016 | Soldner et al. |
| D757,090 S | 5/2016 | Myung |
| D757,746 S | 5/2016 | Lee |
| D757,747 S | 5/2016 | Butcher et al. |
| D757,784 S | 5/2016 | Lee et al. |
| D758,386 S | 6/2016 | Zhang et al. |
| D758,422 S | 6/2016 | Zhao |
| D759,688 S | 6/2016 | Wu |
| 9,361,011 B1 | 6/2016 | Burns |
| 9,361,521 B1 | 6/2016 | McLean et al. |
| 9,380,274 B1 | 6/2016 | McLean et al. |
| D760,769 S | 7/2016 | Ishii et al. |
| D760,792 S | 7/2016 | Liu et al. |
| D761,277 S | 7/2016 | Harvell |
| 9,386,230 B1 | 7/2016 | Duran |
| D762,655 S | 8/2016 | Kai |
| D763,271 S | 8/2016 | Everette et al. |
| D763,306 S | 8/2016 | Lee et al. |
| D763,308 S | 8/2016 | Wang et al. |
| D763,869 S | 8/2016 | Wang et al. |
| D763,888 S | 8/2016 | Patel |
| D763,895 S | 8/2016 | Chaudhri et al. |
| 9,417,637 B2 | 8/2016 | Matsuoka et al. |
| D765,674 S | 9/2016 | Kim |
| D765,678 S | 9/2016 | Goux |
| D766,958 S | 9/2016 | Salazar Cardozo et al. |
| 9,454,820 B1 | 9/2016 | Kirmani |
| D768,687 S | 10/2016 | Bae et al. |
| D769,897 S | 10/2016 | Li |
| D769,930 S | 10/2016 | Agrawal |
| 9,471,452 B2 | 10/2016 | Mcelhinney et al. |
| D770,517 S | 11/2016 | Peng et al. |
| D771,645 S | 11/2016 | Jewitt et al. |
| D772,257 S | 11/2016 | Furutani et al. |
| D772,894 S | 11/2016 | Zhao et al. |
| D773,531 S | 12/2016 | Toth et al. |
| D775,165 S | 12/2016 | Sun et al. |
| 9,513,642 B2 | 12/2016 | Rogers et al. |
| D775,658 S | 1/2017 | Luo et al. |
| D776,126 S | 1/2017 | Lai et al. |
| D776,130 S | 1/2017 | Contreras et al. |
| D776,680 S | 1/2017 | Bae et al. |
| D776,690 S | 1/2017 | Tsujimoto et al. |
| D776,702 S | 1/2017 | Huang et al. |
| D777,744 S | 1/2017 | Wang et al. |
| D779,504 S | 2/2017 | Cabrera et al. |
| D779,533 S | 2/2017 | Liu |
| D780,785 S | 3/2017 | Hansen et al. |
| D781,299 S | 3/2017 | Yun et al. |
| 9,591,215 B1 | 3/2017 | Miller et al. |
| D783,641 S | 4/2017 | Elston et al. |
| D783,652 S | 4/2017 | Guan et al. |
| D784,363 S | 4/2017 | Fleming et al. |
| D784,400 S | 4/2017 | Joi |
| 9,619,984 B2 | 4/2017 | Donovan et al. |
| D786,932 S | 5/2017 | Kim et al. |
| D795,927 S | 5/2017 | Bishchoff et al. |
| 9,660,122 B2 | 5/2017 | Tan |
| D790,581 S | 6/2017 | Chaudhri et al. |
| D791,806 S | 7/2017 | Brewington et al. |
| D794,047 S | 8/2017 | Gandhi et al. |
| D795,292 S | 8/2017 | Loosli et al. |
| D795,919 S | 8/2017 | Bischoff et al. |
| D796,535 S | 9/2017 | Gaur et al. |
| D796,540 S | 9/2017 | McLean et al. |
| D797,131 S | 9/2017 | Mizono et al. |
| D797,772 S | 9/2017 | Mizono et al. |
| D800,747 S | 10/2017 | Lee et al. |
| D800,752 S | 10/2017 | Hersh et al. |
| 9,778,830 B1 | 10/2017 | Dubin |
| D803,233 S | 11/2017 | Wilberding |
| D803,241 S | 11/2017 | Mizono et al. |
| D803,242 S | 11/2017 | Mizono et al. |
| D805,548 S | 12/2017 | King et al. |
| D806,114 S | 12/2017 | Kim et al. |
| 9,838,602 B2 | 12/2017 | Duran et al. |
| D807,376 S | 1/2018 | Mizono et al. |
| D809,522 S | 2/2018 | Mizono et al. |
| D810,116 S | 2/2018 | McLean et al. |
| 9,898,175 B2 | 2/2018 | Fiedler |
| D815,144 S | 4/2018 | Feng et al. |
| D817,337 S | 5/2018 | Wei |
| D817,357 S | 5/2018 | Barajas et al. |
| D818,000 S | 5/2018 | Lee et al. |
| D819,047 S | 5/2018 | Bates et al. |
| D819,075 S | 5/2018 | Tsuji et al. |
| 9,979,862 B1 | 5/2018 | Xiong et al. |
| D821,407 S | 6/2018 | Wilberding |
| D821,410 S | 6/2018 | Vinna et al. |
| D821,441 S | 6/2018 | Wilberding et al. |
| D821,443 S | 6/2018 | Jang et al. |
| D823,867 S | 7/2018 | Berlow |
| D823,891 S | 7/2018 | Lupei et al. |
| D824,416 S | 7/2018 | Memmelaar et al. |
| D824,926 S | 8/2018 | De La Garza |
| D831,673 S | 10/2018 | O'Rourke et al. |
| 10,091,020 B2 | 10/2018 | Han et al. |
| 10,095,933 B2 | 10/2018 | Sherry |
| 10,133,443 B2 | 11/2018 | Von Dehsen et al. |
| 10,145,577 B2 | 12/2018 | Bruck et al. |
| 10,156,959 B2 | 12/2018 | Fulker et al. |
| D837,237 S | 1/2019 | Fraser et al. |
| D841,659 S | 2/2019 | Mehta et al. |
| D842,867 S | 3/2019 | Jedrzejowicz et al. |
| D842,874 S | 3/2019 | Tashiro et al. |
| D842,891 S | 3/2019 | MacLean et al. |
| D843,398 S | 3/2019 | Stewart et al. |
| D844,668 S | 4/2019 | Lee et al. |
| D849,030 S | 5/2019 | Shook et al. |
| 10,281,507 B2 | 5/2019 | Schuh et al. |
| 10,352,496 B2 * | 7/2019 | Mehdi ............... F16M 11/14 |
| 10,353,576 B2 | 7/2019 | Coffman et al. |
| 10,386,999 B2 | 8/2019 | Burns et al. |
| D868,797 S | 12/2019 | Blum et al. |
| 10,586,433 B2 | 3/2020 | Stewart et al. |
| 10,683,962 B2 | 6/2020 | Raghupathy et al. |
| 10,819,921 B2 | 10/2020 | Roth et al. |
| 10,972,685 B2 | 4/2021 | Mehdi et al. |
| 11,035,517 B2 | 6/2021 | Raghupathy et al. |
| 2002/0049979 A1 | 4/2002 | White et al. |
| 2002/0116120 A1 | 8/2002 | Ruiz et al. |
| 2003/0214733 A1 | 11/2003 | Fujikawa et al. |
| 2004/0113770 A1 | 6/2004 | Falk et al. |
| 2004/0177149 A1 | 9/2004 | Zullo et al. |
| 2004/0260427 A1 | 12/2004 | Wimsatt |
| 2005/0046723 A1 | 3/2005 | Bean et al. |
| 2005/0082480 A1 | 4/2005 | Wagner et al. |
| 2005/0104958 A1 | 5/2005 | Egnal et al. |
| 2005/0289615 A1 | 12/2005 | Nishitani |
| 2006/0288392 A1 | 12/2006 | Fleming |
| 2007/0024706 A1 | 2/2007 | Brannon |
| 2007/0025688 A1 | 2/2007 | Pejhan |

(56) References Cited

U.S. PATENT DOCUMENTS

| | | |
|---|---|---|
| 2007/0033632 A1 | 2/2007 | Baynger et al. |
| 2008/0088706 A1 | 4/2008 | Girgensohn et al. |
| 2008/0174570 A1 | 7/2008 | Jobs et al. |
| 2008/0181498 A1 | 7/2008 | Swenson et al. |
| 2008/0263468 A1 | 10/2008 | Cappione et al. |
| 2008/0266393 A1 | 10/2008 | Park |
| 2008/0266445 A1 | 10/2008 | Park |
| 2009/0002157 A1 | 1/2009 | Donavan et al. |
| 2009/0002492 A1 | 1/2009 | Velipasalar et al. |
| 2009/0021583 A1 | 1/2009 | Salgar et al. |
| 2009/0075694 A1 | 3/2009 | Kim et al. |
| 2009/0164439 A1 | 6/2009 | Nevins |
| 2009/0178007 A1 | 7/2009 | Matas et al. |
| 2009/0220206 A1 | 9/2009 | Kisliakov |
| 2009/0284601 A1 | 11/2009 | Eledath |
| 2009/0288011 A1 | 11/2009 | Piran et al. |
| 2010/0023865 A1 | 1/2010 | Fulker et al. |
| 2010/0061446 A1 | 3/2010 | Hands et al. |
| 2010/0079591 A1 | 4/2010 | Lee |
| 2010/0124274 A1 | 5/2010 | Cheok et al. |
| 2010/0131457 A1 | 5/2010 | Heimendinger |
| 2010/0206999 A1 | 8/2010 | Li et al. |
| 2010/0244175 A1 | 9/2010 | Park |
| 2010/0321183 A1 | 12/2010 | Donovan et al. |
| 2011/0040760 A1 | 2/2011 | Fleishman et al. |
| 2011/0090457 A1 | 4/2011 | Shikaumi et al. |
| 2011/0185269 A1 | 7/2011 | Finkelstein et al. |
| 2011/0199517 A1 | 8/2011 | Laberge |
| 2011/0205435 A1 | 8/2011 | Lee et al. |
| 2011/0316697 A1 | 12/2011 | Krahnstoever et al. |
| 2012/0026337 A1 | 2/2012 | Boulanger et al. |
| 2012/0036480 A1 | 2/2012 | Warner et al. |
| 2012/0066608 A1 | 3/2012 | Sundermeyer et al. |
| 2012/0130513 A1 | 5/2012 | Hao et al. |
| 2012/0273630 A1 | 11/2012 | Gillespie-Brown et al. |
| 2012/0280941 A1 | 11/2012 | Hu |
| 2012/0317299 A1 | 12/2012 | Sathianathan et al. |
| 2012/0323930 A1 | 12/2012 | Kennberg et al. |
| 2013/0016122 A1 | 1/2013 | Bhatt et al. |
| 2013/0048837 A1 | 2/2013 | Pope et al. |
| 2013/0067365 A1 | 3/2013 | Shrufi et al. |
| 2013/0072308 A1 | 3/2013 | Peck et al. |
| 2013/0083184 A1 | 4/2013 | Yogesan et al. |
| 2013/0089231 A1 | 4/2013 | Wilk et al. |
| 2013/0090767 A1 | 4/2013 | Bruck et al. |
| 2013/0091432 A1 | 4/2013 | Shet et al. |
| 2013/0129307 A1 | 5/2013 | Choe et al. |
| 2013/0132908 A1 | 5/2013 | Lee et al. |
| 2013/0145270 A1 | 6/2013 | Piran et al. |
| 2013/0173064 A1 | 7/2013 | Fadell et al. |
| 2013/0179836 A1 | 7/2013 | Han et al. |
| 2013/0185150 A1 | 7/2013 | Crum |
| 2013/0211783 A1 | 8/2013 | Fisher et al. |
| 2013/0251150 A1 | 9/2013 | Chassagne |
| 2013/0258313 A1 | 10/2013 | Orband |
| 2013/0263034 A1 | 10/2013 | Bruck et al. |
| 2013/0268129 A1 | 10/2013 | Fadell et al. |
| 2013/0282421 A1 | 10/2013 | Graff et al. |
| 2013/0311909 A1 | 11/2013 | Howard et al. |
| 2013/0325332 A1 | 12/2013 | Rhee et al. |
| 2013/0328997 A1 | 12/2013 | Desi |
| 2013/0332886 A1 | 12/2013 | Cranfill et al. |
| 2014/0012574 A1 | 1/2014 | Pasupalak et al. |
| 2014/0013243 A1 | 1/2014 | Flynn, III et al. |
| 2014/0026061 A1 | 1/2014 | Kim et al. |
| 2014/0033071 A1 | 1/2014 | Gruber et al. |
| 2014/0043485 A1 | 2/2014 | Bateman et al. |
| 2014/0050455 A1 | 2/2014 | Ni et al. |
| 2014/0064738 A1 | 3/2014 | Chen et al. |
| 2014/0098247 A1 | 4/2014 | Rao et al. |
| 2014/0137685 A1* | 5/2014 | Iwayama ............ B25J 18/00 74/490.02 |
| 2014/0189518 A1 | 7/2014 | Kim et al. |
| 2014/0189586 A1 | 7/2014 | Waldman et al. |
| 2014/0218517 A1 | 8/2014 | Kim et al. |
| 2014/0222424 A1 | 8/2014 | Hartford et al. |
| 2014/0232873 A1 | 8/2014 | Meganathan |
| 2014/0277795 A1 | 9/2014 | Matsuoka et al. |
| 2014/0313377 A1 | 10/2014 | Hampton |
| 2014/0333530 A1 | 11/2014 | Agnetta |
| 2014/0333776 A1 | 11/2014 | Dedeoglu |
| 2014/0365019 A1 | 12/2014 | Gourlay et al. |
| 2014/0375819 A1 | 12/2014 | Larsen et al. |
| 2015/0023650 A1 | 1/2015 | Austin et al. |
| 2015/0035987 A1 | 2/2015 | Fernandez |
| 2015/0049243 A1 | 2/2015 | Samuels et al. |
| 2015/0058709 A1 | 2/2015 | Zaletel |
| 2015/0058730 A1 | 2/2015 | Dubin et al. |
| 2015/0097689 A1 | 4/2015 | Logue et al. |
| 2015/0113432 A1 | 4/2015 | Jung et al. |
| 2015/0113461 A1 | 4/2015 | Kasten et al. |
| 2015/0117513 A1 | 4/2015 | Sarafa et al. |
| 2015/0143239 A1 | 5/2015 | Birkbeck et al. |
| 2015/0173846 A1 | 6/2015 | Schneider et al. |
| 2015/0193243 A1 | 7/2015 | Chai et al. |
| 2015/0208205 A1 | 7/2015 | Chan et al. |
| 2015/0224650 A1* | 8/2015 | Xu .................. B25J 9/1697 700/213 |
| 2015/0227196 A1 | 8/2015 | Fujii et al. |
| 2015/0242404 A1 | 8/2015 | Underwood, IV et al. |
| 2015/0248270 A1 | 9/2015 | Lang |
| 2015/0248275 A1 | 9/2015 | Gallo et al. |
| 2015/0269643 A1 | 9/2015 | Riley et al. |
| 2015/0287310 A1 | 10/2015 | Deiiuliis et al. |
| 2015/0310280 A1 | 10/2015 | Bentley et al. |
| 2015/0350265 A1 | 12/2015 | O'Brien |
| 2015/0350611 A1 | 12/2015 | Pearson et al. |
| 2016/0004390 A1 | 1/2016 | Laska et al. |
| 2016/0026329 A1 | 1/2016 | Fadell et al. |
| 2016/0034574 A1 | 2/2016 | Kang |
| 2016/0041724 A1 | 2/2016 | Kirkby et al. |
| 2016/0043905 A1 | 2/2016 | Fiedler |
| 2016/0054175 A1 | 2/2016 | Jia et al. |
| 2016/0086038 A1 | 3/2016 | Scanlon et al. |
| 2016/0088326 A1 | 3/2016 | Solomon et al. |
| 2016/0092720 A1 | 3/2016 | Lee et al. |
| 2016/0105331 A1 | 4/2016 | Han et al. |
| 2016/0105747 A1 | 4/2016 | Cheng |
| 2016/0105847 A1 | 4/2016 | Smith et al. |
| 2016/0110064 A1 | 4/2016 | Shapira |
| 2016/0139671 A1 | 5/2016 | Jun et al. |
| 2016/0139747 A1 | 5/2016 | Kocienda et al. |
| 2016/0147406 A1 | 5/2016 | Yi |
| 2016/0155315 A1 | 6/2016 | McElhinney et al. |
| 2016/0205318 A1 | 7/2016 | Wang et al. |
| 2016/0220743 A1 | 8/2016 | Guthrie et al. |
| 2016/0260414 A1 | 9/2016 | Yang |
| 2016/0306509 A1 | 10/2016 | Jeon et al. |
| 2016/0320875 A1 | 11/2016 | Yoshida |
| 2016/0335139 A1 | 11/2016 | Hurley et al. |
| 2016/0349936 A1 | 12/2016 | Cho et al. |
| 2016/0353531 A1 | 12/2016 | Conner et al. |
| 2016/0358436 A1 | 12/2016 | Wautier et al. |
| 2016/0364114 A1 | 12/2016 | Von Dehsen et al. |
| 2016/0366330 A1 | 12/2016 | Boliek et al. |
| 2017/0003720 A1 | 1/2017 | Robinson et al. |
| 2017/0010790 A1 | 1/2017 | Glover et al. |
| 2017/0017376 A1 | 1/2017 | Han et al. |
| 2017/0017384 A1 | 1/2017 | Lee |
| 2017/0017392 A1 | 1/2017 | Castaneda et al. |
| 2017/0034430 A1 | 2/2017 | Fu et al. |
| 2017/0060374 A1 | 3/2017 | Murrels et al. |
| 2017/0060399 A1 | 3/2017 | Hough et al. |
| 2017/0089739 A1 | 3/2017 | Gallo |
| 2017/0126975 A1 | 5/2017 | Duran et al. |
| 2017/0140221 A1 | 5/2017 | Ollila et al. |
| 2017/0168374 A1 | 6/2017 | Lin et al. |
| 2017/0186079 A1 | 6/2017 | Kim et al. |
| 2017/0201850 A1 | 7/2017 | Raleigh et al. |
| 2017/0207949 A1 | 7/2017 | Donaovan et al. |
| 2017/0286913 A1 | 10/2017 | Liu et al. |
| 2017/0308390 A1 | 10/2017 | Venis et al. |
| 2017/0329511 A1 | 11/2017 | Ueno et al. |
| 2017/0336920 A1 | 11/2017 | Chan et al. |

(56) References Cited

U.S. PATENT DOCUMENTS

| | | | |
|---|---|---|---|
| 2017/0357439 | A1 | 12/2017 | Lemay et al. |
| 2018/0013934 | A1 | 1/2018 | Germe et al. |
| 2018/0018081 | A1 | 1/2018 | Dattilo-Green et al. |
| 2018/0019889 | A1 | 1/2018 | Burns et al. |
| 2018/0048819 | A1 | 2/2018 | Duran et al. |
| 2018/0101297 | A1 | 4/2018 | Yang et al. |
| 2018/0113577 | A1 | 4/2018 | Burns et al. |
| 2018/0115788 | A1 | 4/2018 | Burns et al. |
| 2018/0129380 | A1 | 5/2018 | Suh et al. |
| 2018/0136819 | A1 | 5/2018 | Lee et al. |
| 2018/0144615 | A1 | 5/2018 | Kinney et al. |
| 2018/0157915 | A1 | 6/2018 | Sherry |
| 2018/0187954 | A1 | 7/2018 | Yang et al. |
| 2018/0232592 | A1 | 8/2018 | Stewart et al. |
| 2018/0259832 | A1 | 9/2018 | Chen et al. |
| 2018/0263104 | A1 | 9/2018 | Hamada et al. |
| 2018/0267390 | A1 | 9/2018 | Kim et al. |
| 2018/0311582 | A1 | 11/2018 | Gerhard et al. |
| 2018/0330169 | A1 | 11/2018 | van Hoof et al. |
| 2018/0340646 | A1 | 11/2018 | Mehdi et al. |
| 2018/0343402 | A1 | 11/2018 | Roth et al. |
| 2018/0343403 | A1 | 11/2018 | Mehdi et al. |
| 2018/0343772 | A1 | 11/2018 | Raghupathy et al. |
| 2018/0349708 | A1 | 12/2018 | van Hoof et al. |
| 2019/0394905 | A1 | 12/2019 | Jin et al. |
| 2020/0236266 | A1 | 7/2020 | Krammer et al. |
| 2020/0332947 | A1 | 10/2020 | Raghupathy et al. |
| 2021/0029308 | A1 | 1/2021 | Roth et al. |
| 2021/0216787 | A1 | 7/2021 | Van Hoof et al. |
| 2021/0278030 | A1 | 9/2021 | Raghupathy et al. |

FOREIGN PATENT DOCUMENTS

| | | |
|---|---|---|
| CN | 202083867 | 12/2011 |
| CN | 103167225 | 6/2013 |
| CN | 203563151 | 4/2014 |
| CN | 204272247 | 4/2015 |
| CN | 105072325 | 11/2015 |
| CN | 105813554 | 7/2016 |
| CN | 106205052 | 12/2016 |
| CN | 206042146 | 3/2017 |
| CN | 206136087 | 4/2017 |
| CN | 206181243 | 5/2017 |
| JP | 2009219019 | 9/2009 |
| JP | 2015139165 | 7/2015 |
| KR | 20080005117 | 11/2008 |
| KR | 20120068655 | 6/2012 |
| KR | 20150065169 | 6/2015 |
| KR | 20150092670 | 8/2015 |
| WO | 2006120596 | 11/2006 |
| WO | 2009138037 | 11/2009 |
| WO | 2013009828 | 1/2013 |
| WO | 2014137372 | 9/2014 |

OTHER PUBLICATIONS

"Advisory Action", U.S. Appl. No. 15/607,387, filed Nov. 1, 2019, 3 pages.
"Advisory Action", U.S. Appl. No. 15/608,904, filed Nov. 8, 2019, 3 pages.
"AppCrawlr, ipCam FC—IP camera surveillance (ios)", Retrieved at appcrawlr.com/ios/ipcam-fc-ip-camera-surveillance—on Jul. 16, 2015, 2 pages.
"Arlo on the App Store on iTunes", Retrieved at https://apps.apple.com/us/app/arlo/id925911312—on Jul. 15, 2015, 2 pages.
"Bluetooth-conrolled Pan/Tilt Servo Platform Using Android as Remote", Retrieved at: www.techbitar.com/bluetooth-controlled-pan-tilt-servo.html—on Nov. 19, 2020, 8 pages.
"D-Link Corporation, mydlinkApp", Retrieved at: www.mydlink.com/apps—on Jul. 15, 2015, 4 pages.
"D-Link Corporation, mydlink Lite", downloaded Jul. 15, 2015 from: itunes.apple.com/us/app/mydlink-lite/id372571229?mt=8, 2 pages.
"D-Link Corporation, mydlink+,", downloaded Jul. 15, 2015, From: itunes.apple.com/us/app/mydlink/id479832296?mt=8, 2 pages.
"Dropcam", Retrieved from: https://play.google.com/store/apps/details?id=com.dropcam.android, Aug. 20, 2015, 3 pages.
"Extended European Search Report", EP Application No. 18156966.6, dated Jun. 26, 2018, 11 pages.
"Features> Button Bars", Available from Internet: http://insiteout.brinkster.net/Website%20New/buttonbars.asp, May 8, 2011, 6 pages.
"Final Office Action", U.S. Appl. No. 15/607,387, filed Aug. 21, 2019, 12 pages.
"Final Office Action", U.S. Appl. No. 15/608,904, filed Jan. 22, 2020, 18 pages.
"Final Office Action", U.S. Appl. No. 15/608,904, filed Aug. 1, 2019, 21 pages.
"Final Office Action", U.S. Appl. No. 15/607,380, filed Dec. 20, 2019, 6 pages.
"First Action Interview Office Action", U.S. Appl. No. 15/607,380, filed Mar. 18, 2019, 13 pages.
"First Action Interview Office Action", U.S. Appl. No. 15/607,387, filed Mar. 7, 2019, 15 pages.
"First Action Interview Office Action", U.S. Appl. No. 15/607,368, filed Mar. 18, 2019, 19 pages.
"First Action Interview Office Action", U.S. Appl. No. 15/608,904, filed Dec. 10, 2018, 4 pages.
"First Action Interview Office Action", U.S. Appl. No. 15/594,518, filed Dec. 11, 2018, 4 pages.
"Foreign Office Action", KR Application No. 2019-7037435, dated Nov. 17, 2020, 12 pages.
"Foreign Office Action", EP Application No. 18156966.6, dated May 25, 2020, 5 pages.
"Foto de archivo", Retrieved at: https://es.123rf.com/photo_37507296_diseno-transparente-plantilla-de-interfaz-de-usuario-movil-disposicion-para-el-movil-pagina-web-il.html, Apr. 23, 2015, 3 pages.
"Google Image Search of Nest Icon", Retrieved from: https://www.google.com/search?q=nest+icon&rlz=1C1GCEBenUS799US799&biw=1920&bih=1109&source=Int&tbs=cdr%3A1%2Ccdnnin%3A%2Ccdnnax%3A7%2, 2 pages.
"International Preliminary Reporton Patentability", Application No. PCT/US2018/020900, dated Nov. 26, 2019, 12 pages.
"International Preliminary Report on Patentability", Application No. PCT/US2018/020919, dated Nov. 12, 2019, 8 pages.
"International Search Report and Written Opinion", Application No. PCT/US2015/039425, dated Sep. 25, 2015, 12 pages.
"International Search Report and Written Opinion", Application No. PCT/US2018/020900, dated Jul. 2, 2018, 18 pages.
"International Search Report and Written Opinion", Application No. PCT/US2018/020919, dated Jun. 11, 2018, 26 pages.
"Metal Fence on a dark background", Retrieved at: https://stockfresh.com/image/2626471/metal-fence-on-a-dark-background, Feb. 28, 2013, 1 page.
"Mini UI toolkit PSD Download", www.freepsds123.com/2014/06/21/mini-ui-toolkit-psd-download/, Jun. 21, 2014, 1 page.
"Netgear, Home Security Systems/ Security Cameras/ Arlo", http://www.arlo.com/en-US/, Jul. 16, 2015, 6 pages.
"Non-Final Office Action", U.S. Appl. No. 15/606,888, filed Oct. 5, 2018, 11 pages.
"Non-Final Office Action", U.S. Appl. No. 15/607,380, filed Apr. 7, 2020, 12 pages.
"Non-Final Office Action", U.S. Appl. No. 15/607,380, filed Jul. 31, 2020, 17 pages.
"Non-Final Office Action", U.S. Appl. No. 15/607,368, filed Jan. 22, 2020, 18 pages.
"Non-Final Office Action", U.S. Appl. No. 15/608,904, filed Aug. 7, 2020, 21 pages.
"Non-Final Office Action", U.S. Appl. No. 15/594,518, filed Apr. 2, 2019, 25 pages.
"Non-Final Office Action", U.S. Appl. No. 15/608,904, filed Apr. 11, 2019, 26 pages.
"Non-Final Office Action", U.S. Appl. No. 16/903,049, filed Sep. 16, 2020, 9 pages.
"Notice of Allowance", U.S. Appl. No. 15/607,387, filed Feb. 10, 2020, 16 pages.

(56) References Cited

OTHER PUBLICATIONS

"Notice of Allowance", U.S. Appl. No. 15/607,368, filed Jun. 19, 2020, 5 pages.
"Notice of Allowance", U.S. Appl. No. 15/606,888, filed Mar. 6, 2019, 8 pages.
"Octopussy (1983)—Cancelled", https://www.mi6-hq.com/sections/games/octopussy_1983, Oct. 2, 2014, 2 pages.
"Pre-Interview First Office Action", U.S. Appl. No. 15/607,368, filed Jan. 11, 2019, 3 pages.
"Pre-Interview First Office Action", U.S. Appl. No. 15/607,380, filed Jan. 11, 2019, 3 pages.
"Pre-Interview First Office Action", U.S. Appl. No. 15/607,387, filed Oct. 12, 2018, 3 pages.
"Pre-Interview First Office Action", U.S. Appl. No. 15/594,518, filed Sep. 4, 2018, 5 pages.
"Pre-Interview First Office Action", U.S. Appl. No. 15/608,904, filed Sep. 7, 2018, 5 pages.
"Pulsating Animation", Retrieved at: https://dribbble.com/shots/3218158-Pulsating-animation, Jan. 15, 2017, 1 page.
"Simi, ipCamFC—IP camera surveillance", Retrieved at: itunes.apple.com/us/app/ipcam-fc-ip-camera-surveillance/id548480721?mt=8—on Jul. 15, 2015, 2 pages.
"Stock Vector—Web Site Interface Icons // Button Bar Series", https://www.alamy.com/web-site-interface-icons-button-bar-series-image64003090.html, Aug. 2010, 1 page.
"Two-Shot Injection Molding Solutions", https://geminigroup.net/plastics/two-shot-and-injection-molding-tpi/processes/two-shot-multi-shot/, May 14, 2020, 8 pages.
"Vector Video Player", Retrieved at: https://www.shutterstock.com/fr/image-vector/vector-audio-video-player-web-101573365, Aug. 21, 2014, 4 pages.
"Viewer For D-Link Cams IOS Version 3.1.2, 2013", Retrieved at: http://www.eyespyfx.com/dlink.php—on Jul. 15, 2015, 19 pages.
Ahmed, Nafees, "5 Best Video Editing Apps for Android Devices", Retrieved at: http://techbuzzes.com/2013/03/best-video-editing-apps-for-android/, Mar. 23, 2013, 10 pages.
Baer, Drake, "Apple Has Reportedly Reversed the Ban on This Mindfulness App From the App Store", Apr. 12, 2017, 2 pages.
Blatner, , "WiCam: Wireless iPhone Camera, Rochester Institute of Technology", Retrieved at: www.ce/rit/edu/research/projects/2010-spring/WICam/index.html—on Jul. 15, 2015, 1 page.
Fitzner, Michael, "Editing Effects Software to Make Your Video Sing", May 1, 2012, 7 pages.
Hoang, Le , "YouTube: How to Find Previously Watched Videos", Retrieved at: https://www.tech-recipes.com/rx/11104/youtube-how-to-find-all-the-previously-watched-videos/, Apr. 15, 2011, 2 pages.
Lipton, U A. et al., "Moving Target Classification and Tracking from Real-Time Video", Oct. 1998, 7 pages.
McKenna, Stephen J. et al., "Tracking Groups of People", Oct. 2000, 15 pages.
Mooji, Andre , "Tap to Begin", Available at: https://dribbble.com/shots/3113672-Tap-to-Begin, 2016, 2 pages.
Nunal, Paul , "Best Android apps for videographers and video editors", May 3, 2012, 12 pages.
Raiz, Greg , "Wireframe toolkit for Keynote and Powerpoint", Jun. 29, 2011, 7 pages.
Russel, Holly , "Nest Aware, and why the Nest Cam subscription makes sense", https://www.androidcentral.com/nest-aware-and-why-nest-cam-subscription-makes-sense, Jul. 3, 2015, 5 pages.
Tenon, Biff , "Abstract background with animation of flicker and moving patterns from clear colorful circles. Animation of seamless loop", Retrieved at: https://www.shutterstock.com/fr/video/clip-24321839-abstract-background-animation-flicker-moving-patterns-clear—on Nov. 2020, 3 pages.
Viola, Paul et al., "Rapid Object Detection Using a Boosted Cascade of Simple Features", Feb. 2001, 11 pages.
Visavadia, Jay , "i0S7 Wireframe", https://dribbble.com/shots/1352315-i0S7-Wireframe, Dec. 19, 2013, 1 page.
Wilson, Phillip I. et al., "Facial Feature Detection Using Haar Classifiers", Apr. 2006, 7 pages.
Wollerton, Megan , "Netgear Arlo Smart Home Security review: Netgear's Arlo defies typical security camera limitations", www.cnet.com/products/netgear-arlo-smart-home-security-kit, Feb. 2, 2015, 5 pages.
Wollerton, Megan , "Turn your old iPod into a security camera for free, CNET,", https://www.cnet.com/how-to/turn-your-old-ipod-into-a-security-camera-for-free/, Dec. 17, 2014, 3 pages.
"Final Office Action", U.S. Appl. No. 15/608,904, filed Dec. 28, 2020, 24 pages.
"Foreign Office Action", EP Application No. 18714648.5, dated Jan. 27, 2021, 7 pages.
"Notice of Allowance", U.S. Appl. No. 15/607,380, filed Feb. 2, 2021, 5 pages.
"Notice of Allowance", U.S. Appl. No. 16/903,049, filed Feb. 9, 2021, 8 pages.
"Supplemental Notice of Allowance", U.S. Appl. No. 15/607,380, filed Mar. 3, 2021, 2 pages.
"Foreign Notice of Allowance", KR Application No. 10-2019-7037435, dated May 25, 2021, 4 pages.
"Foreign Office Action", CN Application No. 201880033742.0, dated May 27, 2021, 26 pages.
"Non-Final Office Action", U.S. Appl. No. 17/067,367, dated Jun. 29, 2021, 18 pages.
"Foreign Office Action", JP Application No. 2019-564859, dated Aug. 17, 2021, 5 pages.

\* cited by examiner

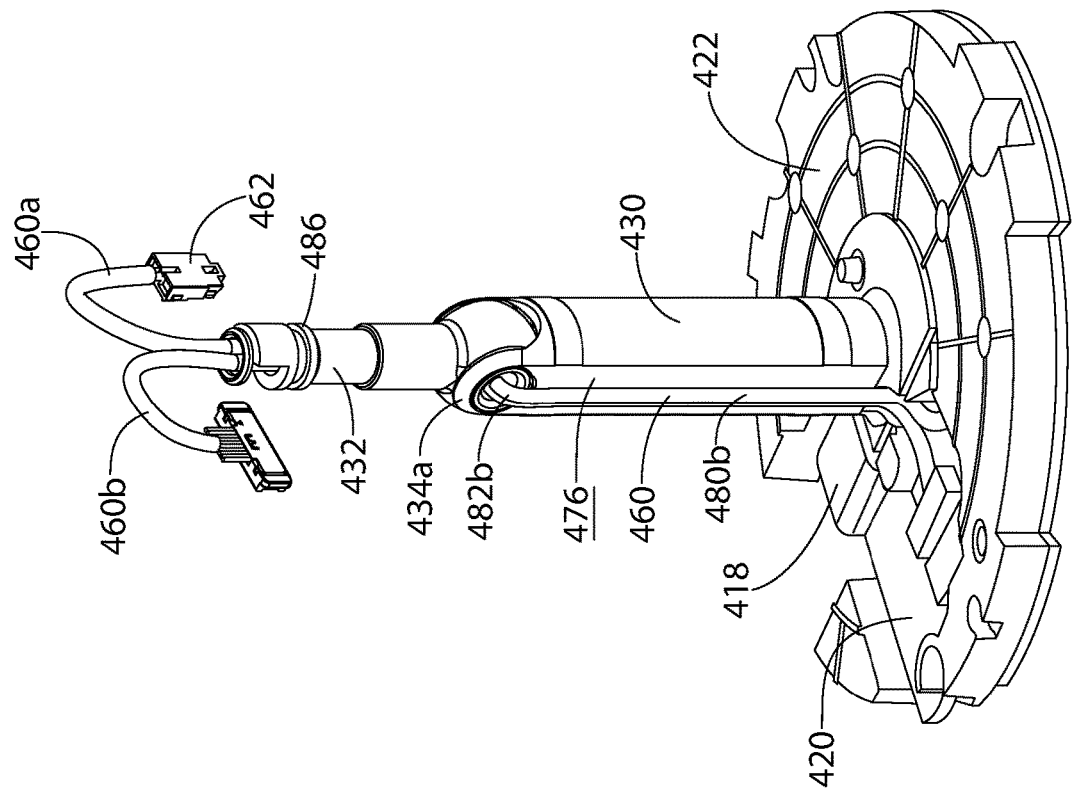
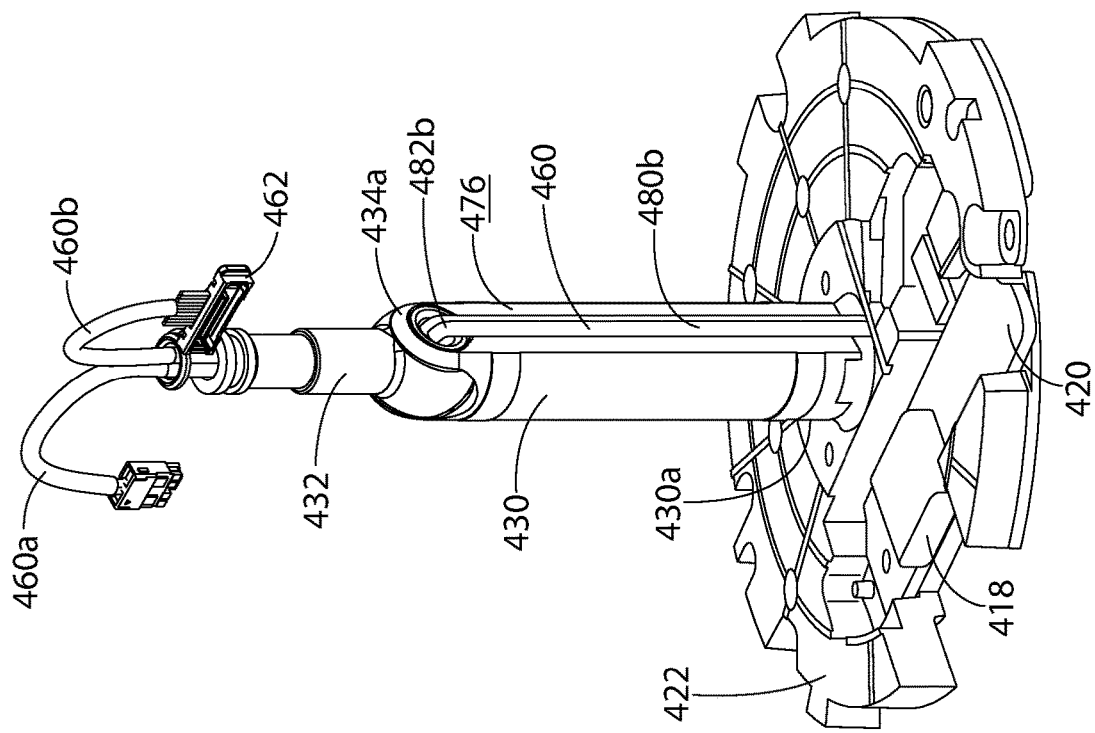

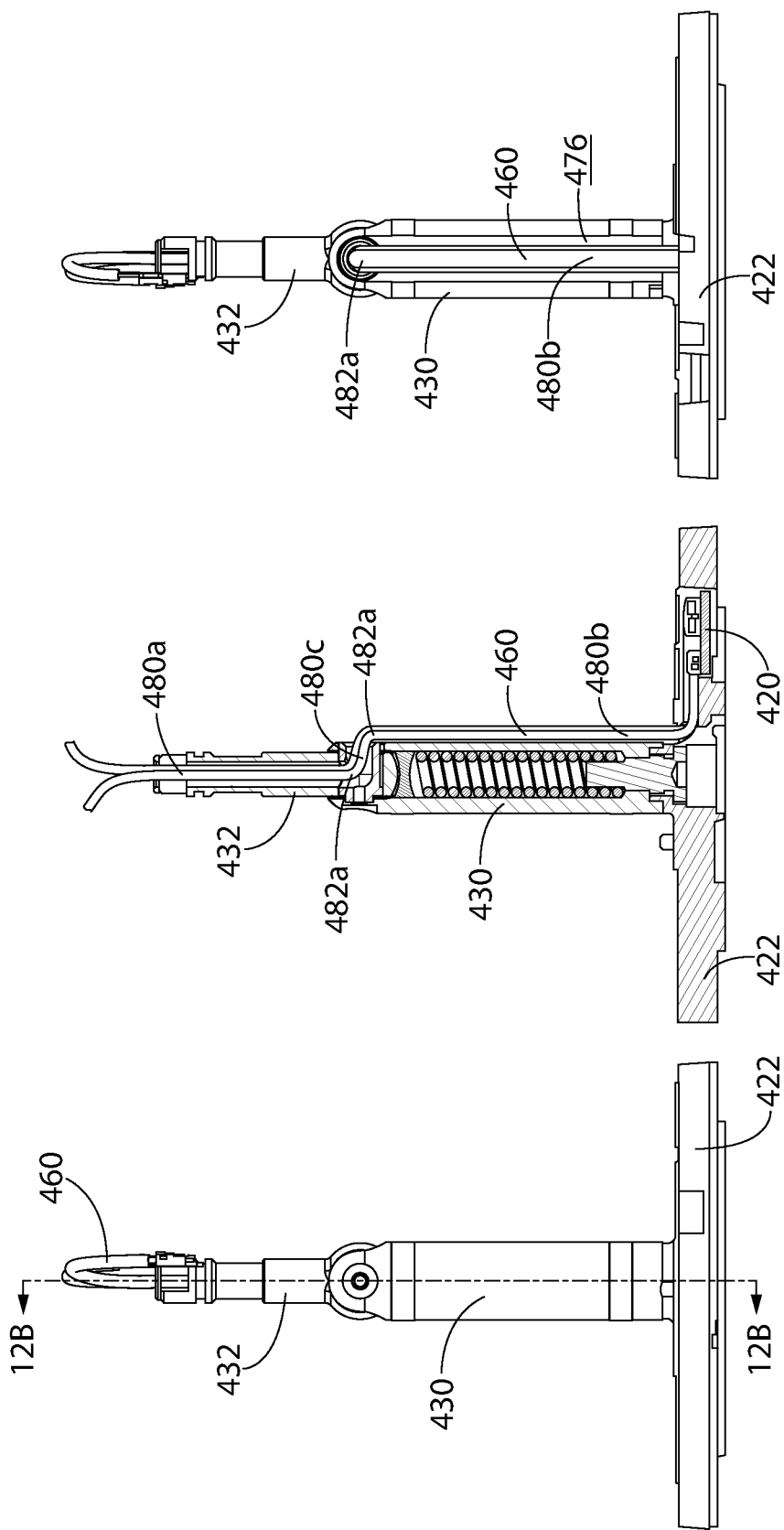

STAND ASSEMBLY FOR AN ELECTRONIC DEVICE PROVIDING MULTIPLE DEGREES OF FREEDOM AND BUILT-IN CABLES

RELATED APPLICATIONS

This application is a continuation of U.S. patent application Ser. No. 15/606,888 filed May 26, 2017, which claims priority to U.S. Provisional Application No. 62/511,302, filed May 25, 2017, entitled "Video Camera Assembly," each of which is hereby incorporated by reference in its entirety.

This application is related to U.S. patent application Ser. No. 15/607,387, filed May 26, 2017, entitled "Thermal Management for a Compact Electronic Device," U.S. patent application Ser. No. 15/607,368, filed May 26, 2017, entitled "Camera Assembly Having a Single-Piece Cover Element," U.S. patent application Ser. No. 15/607,380, filed May 26, 2017, entitled "Video Camera Assembly having an IR Reflector," and U.S. Design application No. 29/605,503, filed May 26, 2017, entitled "Camera," each of which is hereby incorporated by reference in its entirety.

TECHNICAL FIELD

The present invention relates to a stand assembly for an electronic device, including but not limited to a stand assembly for a camera device. The present invention also relates to systems including the stand assembly.

BACKGROUND

Usage of video cameras for surveillance or other tasks in residential and commercial environments has increased substantially, in part due to lower costs, the prevalence of sophisticated mobile devices having remote monitoring and control capabilities, and the increased availability of connectivity bandwidth. As consumer demands change and the complexity of home automation and related systems increases, various new challenges arise in designing such camera products. For example, many home security cameras need to be affixed to a surface to ensure stability and enable changes in orientation, but doing so limits placement flexibility. In some cases, although a camera's orientation may be adjusted, the desired field of view may drift from that orientation. Further difficulties arise in physical connectivity—external cable wiring to the camera often not only creates undesirable visual appearances but also may limit the range of motion of the camera.

SUMMARY

The present invention according to some implementations addresses the above needs and desires by providing a compact stand assembly for relatively heavy cameras or other electronic devices. In some implementations, a stand assembly according to the present invention allows the camera or other electronic device to be oriented in at least two degrees of freedom without having to be fixed onto a supporting surface. In some implementations, the stand assembly also provides a reliable and visually hidden routing path for electrical wiring for the camera (e.g., for transmission of power and electrical signals) in a wide range of camera orientations.

A stand assembly according to some implementations includes a neck portion having a first end that holds the electronic device and a second end arranged opposite the first end, and a spine portion that is coupled via a joint structure to the second end of the neck portion, wherein the joint structure is configured to provide a first rotational degree of freedom of the neck portion with respect to the spine portion. In further implementations, the stand assembly includes one or more interconnect wires including a first wire portion, a second wire portion and a third wire portion. In some implementations, the first wire portion is routed through an interior of the neck portion, the second wire portion is routed along a surface of the spine portion, and the third wire portion is routed though the joint structure from the surface of the spine portion to the interior of the neck portion, thereby enabling the first and second wire portions to be positionally reorientated with respect to one another in accordance with the first rotational degree of freedom. In some implementations, the one or more interconnect wires are structurally invisible to a user of the stand assembly. In some implementations, the one or more interconnect wires are completely hidden within the electronic device and the stand assembly. In some implementations, the stand assembly includes a head portion mounted onto the neck portion which is or includes the electronic device. The head portion, in some implementations, is mounted on the first end of the neck portion and is configured to rotate with respect to the neck portion about a central axis of the neck portion. In some implementations, the head portion is or includes a camera (e.g., a video camera).

In some implementations, rotation of the neck portion at the first rotational degree of freedom has substantially consistent resistance through a first full range of rotation. In some implementations, the neck portion is configured to be tilted from a forward orientation to a backward orientation within the first full range of rotation. In some implementations, the first full range of rotation is associated with a tilting angle that is substantially equal to 180 degrees and substantially symmetric with respect to a first nominal position of the neck position. In some implementations, the neck portion is substantially aligned with the spine portion at the first nominal position.

In some implementations, the spine portion includes a spring coupled to the joint structure, such that when depressed, the spring applies a force on the joint structure and/or the second end of the neck portion and thereby creates at least a portion of the substantially consistent resistance associated with the first degree of freedom of rotation of the neck portion. In some implementations, the first rotational degree of freedom of the joint structure is associated with pivoting of the neck portion and the electronic device about the axis of rotation, the axis of rotation being substantially parallel to a planar surface of a base shaped to rest against a supporting surface. In some implementations, the first rotational degree of freedom has a first full range of rotation, and the base is configured to rest against the supporting surface without causing tipping of the electronic device when the neck portion rotates within the first full range of rotation of the first rotational degree of freedom. In some implementations, the base has a first center of mass and the electronic device has a second center of mass, and the first and second centers of mass are engineered to protect the electronic device from tipping when the neck portion rotates within the first full range of rotation of the first rotational degree of freedom.

In some implementations, the electronic device is further configured to rotate at a second rotational degree of freedom with respect to the neck portion. In some implementations, rotation of the electronic device at the second rotational degree of freedom has substantially consistent resistance through a second full range of rotation. In some implementations, the electronic device further includes one or more clamping mechanisms that wrap around the neck portion to create the substantially consistent resistance associated with the second full range of rotation, the one or more clamping mechanisms being concealed within the electronic device. In some implementations, the second full range of rotation is associated with a twisting angle that is substantially equal to 180 degrees, and the twisting angle is substantially symmetric with respect to a second nominal position of the electronic device. In some implementations, when the neck and spine portions are aligned and when the electronic device is rotated to the second nominal position at the second degree of freedom of rotation, the electronic device is configured to face towards a second nominal direction. In some implementations, the first end of the neck portion includes a slot, and an interior of the electronic device includes one or more stops, wherein the slot and the one or more rotation stops mate with each other and are configured to define the second full range of rotation when the neck portion and the electronic device rotate with respect to the neck portion. In some implementations, the second rotational degree of freedom is associated with twisting of the electronic device with respect to a twisting axis that passes through a central axis of the neck portion. In some implementations, the base has a size and a weight both of which are configured to protect the electronic device from tipping when the neck portion rotates within the first full range of rotation of the first rotational degree of freedom.

In some implementations, the one or more interconnect wires includes a single interconnect wire. In some implementations, the one or more interconnect wires includes a plurality of discreet wires held into an interconnect wire bundle, and are configured to provide data and power to the electronic device. In some implementations, the electronic device includes first electronic circuitry, and the first electronic circuitry is electrically coupled to second electronic circuitry via the one or more interconnect wires. In some implementations, the stand assembly further includes a base shaped to rest against a supporting surface, wherein the spine portion extends from and is fixed onto the base, and the second electronic circuitry is disposed within the base. In some implementations, the base further includes an electronic connector that is exposed from a rim side of the base and inset into a body of the base, wherein the electronic connector is electrically coupled to the third wire portion of the one or more interconnect wires within the base. In some implementations, when the neck and spine portions are substantially aligned and when the electronic device is rotated to the second nominal position at the second degree of freedom of rotation, the electronic device is configured to face towards a second nominal direction and the electronic connector is configured to face away from the second nominal direction. In some implementations, when the electronic connector is coupled to an external connector, a connection interface is formed between the electronic and external connectors and concealed within the base. In some implementations, the electronic connector includes a micro-universal serial bus (Micro USB) receptacle.

In some implementations, the base further comprises a threaded screw hole that is disposed at a bottom surface of the base and matches a tripod screw of a standard tripod, and the stand assembly is configured to mount on the standard tripod when the tripod screw is substantially tightened into the threaded screw hole. In some implementations, the base further includes a magnetic plate, wherein the magnetic plate is disposed adjacent to or forms a portion of a bottom surface of the base, and the magnetic plate has a bottom surface area that is smaller than a surface area of the bottom surface of the base. In some implementations, one or more rubber patches are attached to a bottom surface of the base to provide additional friction between the stand assembly and the supporting surface against which the base is rested, wherein the one or more rubber patches includes a rubber ring that is attached to the bottom surface of the base. In further implementations, the stand assembly additionally includes a mount structure that is configured to be attached and fixed onto a supporting surface using one or more mount fasteners, wherein at least a part of the mount structure is made of magnetically attractable material, and the stand assembly is mounted onto the supporting surface when a base of the stand assembly magnetically adheres onto the mount structure.

In some implementations, the stand assembly further includes a stem cover configured to cover the spine portion, wherein the second portion of the one or more interconnect wires are concealed between the spine portion and the stem cover, and is structurally invisible to a user of the stand assembly. In some implementations, the stem cover is made of a single piece of material and has an aspect ratio that exceeds an aspect ratio threshold. In some implementations, the stand assembly includes a base shaped to rest against a supporting surface, the spine portion extending from and being fixed onto the base, and a stem cover mechanically coupled onto the base independently of the spine portion, the stem cover being configured to conceal the spine portion and the one or more interconnect wires and provide protection thereto.

In some implementations, the joint structure includes a first joint sub-structure located at the second end of the neck portion, a second joint sub-structure located at an end of the spine portion, and a third joint sub-structure that couples the first and second joint sub-structures, the first, second and third sub-structures being distinct from each other. In some implementations, wherein the third joint sub-structure includes at least one of a screw and a rivet, and the at least one of a screw and a rivet creates a lateral tension to couple the first joint sub-structure of the neck portion and the second joint sub-structure of the spine portion.

In further implementations, the present invention provides a stand assembly for an electronic device which includes an interconnect wire, holding means for holding the electronic device, and guiding means for guiding the interconnect wire. The electronic device may be a camera (e.g., a video or still camera) according to some implementations. In some implementations, the holding means includes a first end that holds the electronic and a second end arranged opposite the first end the guiding means being coupled via a joint structure to the second end of the holding means. In some implementations, the joint structure is configured to provide a first rotational degree of freedom of the holding means with respect to the guiding means. In some implementations, the interconnect wire includes a first wire portion, a second wire portion and a third wire portion, the first wire portion being routed through an interior of the holding means, the second wire portion being routed along a surface of the guiding means, and the third wire portion being routed though the joint structure from the surface of the guiding means to the interior of the holding means, thereby enabling the first and second wire portions to be positionally reoriented with respect to one another in accordance with the first rotational degree of freedom. In some implementations, the stand assembly further includes a support means for resting against a supporting surface and for housing electronic circuitry. In some implementations, the guiding means is fixed to and extends from the support means. In some implementations, the stand assembly includes a cover means for concealing the guiding means and at least a portion of the interconnect wire, the cover means being coupled onto the base independently of the guiding means. In some implementations, the electronic device includes first electronic circuitry, the first electronic circuitry being electrically coupled to second electronic circuitry disposed within the support means via the interconnect wire. In some implementations, the interconnect wire is structurally invisible to a user of the stand assembly. In some implementations, the interconnect wire is completely hidden within the electronic device and the stand assembly.

In some implementations, the guiding means includes a biasing means for applying a force against the holding means to create a substantially consistent resistance associated with the first rotational degree of freedom. In some implementations, the electronic device is configured to rotate at a second rotational degree of freedom with respect to the holding means, the second rotational degree of freedom being associated with twisting of the electronic device about a twisting axis that passes through a central axis of the holding means. In some implementations, the rotation of the electronic device at the second rotational degree of freedom includes a substantially consistent resistance through a second full range of rotation. In some implementations, a clamping means is provided to couple the electronic device with the holding means. In some implementations, the clamping means is configured to rotate about the holding means and prevent separation of the electronic device from the holding means.

BRIEF DESCRIPTION OF THE DRAWINGS

For a better understanding of the various described implementations, reference should be made to the Description of Implementations below, in conjunction with the following drawings in which like reference numerals refer to corresponding parts throughout the figures.

FIGS. 10A and 10B are perspective views of the stand assembly of FIG. 8A with the stem cover and base cover removed, in accordance with some implementations.

FIG. 12A is a left side view of the stand assembly of FIG. 10A, in accordance with some implementations.

FIG. 12B is a cross-sectional view of the stand assembly taken along the plane designated by line 12B-12B of FIG. 12A.

FIG. 12C is a right side view of the stand assembly of FIG. 12A, in accordance with some implementations.

DETAILED DESCRIPTION

Reference will now be made in detail to implementations, examples of which are illustrated in the accompanying drawings. In the following detailed description, numerous specific details are set forth in order to provide a thorough understanding of the various described implementations. However, it will be apparent to one of ordinary skill in the art that the various described implementations may be practiced without these specific details. In other instances, well-known methods, procedures, components, circuits, and networks have not been described in detail so as not to unnecessarily obscure aspects of the implementations.

Figure 1:
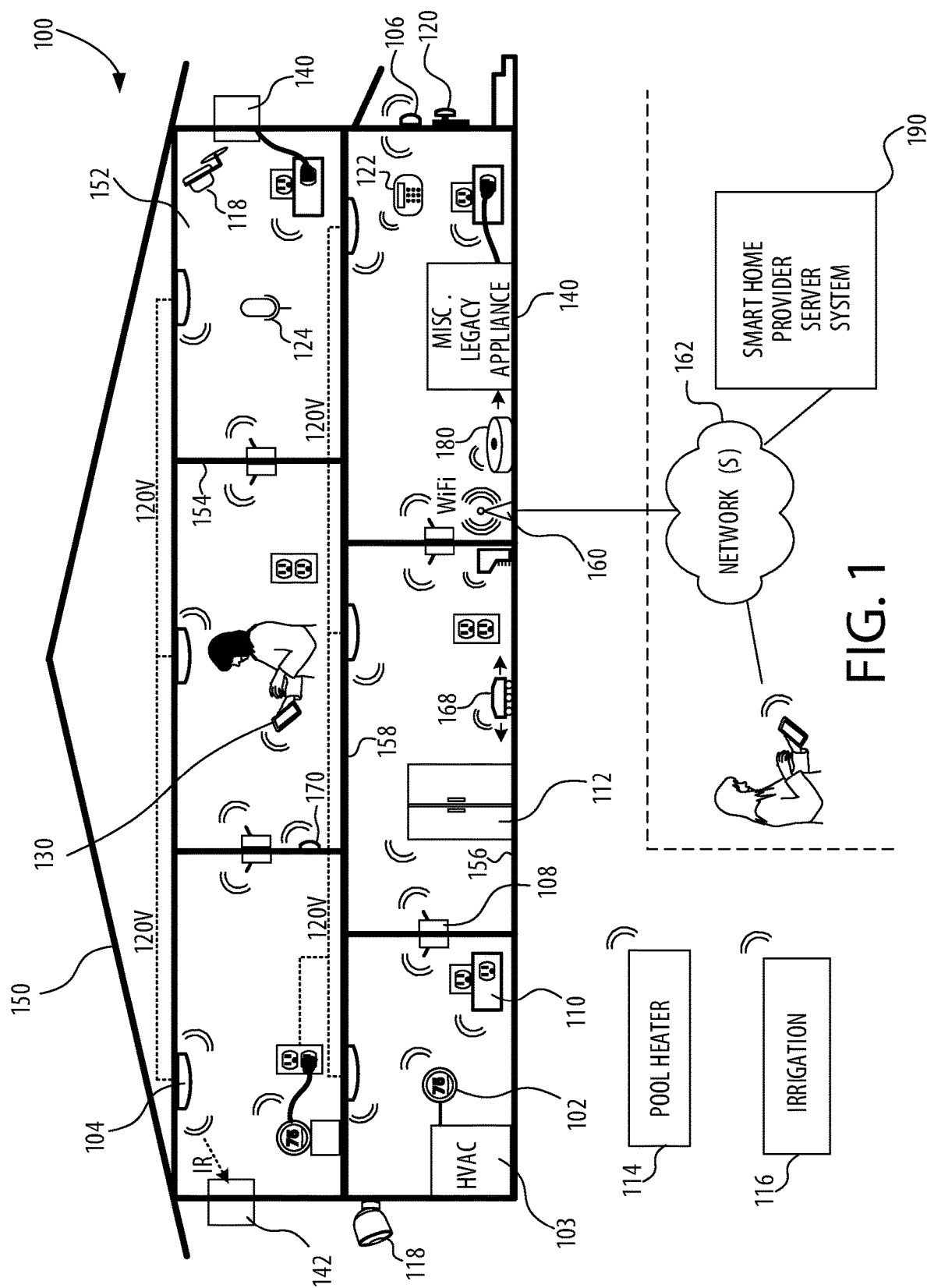
FIG. 1 is an example smart home environment, in accordance with some implementations.

FIG. 1 is an example smart home environment 100 in accordance with some implementations. Smart home environment 100 includes a structure 150 (e.g., a house, office building, garage, or mobile home) with various integrated devices. It will be appreciated that devices may also be integrated into a smart home environment 100 that does not include an entire structure 150, such as an apartment, condominium, or office space. Further, the smart home environment 100 may control and/or be coupled to devices outside of the actual structure 150. Indeed, several devices in the smart home environment 100 need not be physically within the structure 150. For example, a device controlling a pool heater 114 or irrigation system 116 may be located outside of the structure 150.

The depicted structure 150 includes a plurality of rooms 152, separated at least partly from each other via walls 154. The walls 154 may include interior walls or exterior walls. Each room may further include a floor 156 and a ceiling 158. Devices may be mounted on, affixed to, integrated with and/or supported by a wall 154, floor 156 or ceiling 158. In some implementations, electronic tags are affixed to a wall 154, floor 156, ceiling 158, window, or door.

In some implementations, the integrated devices of the smart home environment 100 include intelligent, multi-sensing, network-connected devices that integrate seamlessly with each other in a smart home network and/or with a central server or a cloud-computing system to provide a variety of useful smart home functions. The smart home environment 100 may include one or more intelligent, multi-sensing, network-connected thermostats 102 (hereinafter referred to as "smart thermostats 102"), one or more intelligent, network-connected, multi-sensing hazard detection units 104 (hereinafter referred to as "smart hazard detectors 104"), one or more intelligent, multi-sensing, network-connected entryway interface devices 106 and 120 (e.g., "smart doorbells 106" and "smart door locks 120"), and one or more intelligent, multi-sensing, network-connected alarm systems 122 (hereinafter referred to as "smart alarm systems 122"). In some implementations, the one or more smart thermostats 102 detect ambient climate characteristics (e.g., temperature and/or humidity) and control a HVAC system 103 accordingly. For example, a respective smart thermostat 102 includes an ambient temperature sensor.

The one or more smart hazard detectors 104 may include thermal radiation sensors directed at respective heat sources (e.g., a stove, oven, other appliances, a fireplace, etc.). For example, a smart hazard detector 104 in a kitchen 153 includes a thermal radiation sensor directed at a stove/oven 112. A thermal radiation sensor may determine the temperature of the respective heat source (or a portion thereof) at which it is directed and may provide corresponding blackbody radiation data as output.

The smart doorbell 106 and/or the smart door lock 120 may detect a person's approach to or departure from a location (e.g., an outer door), control doorbell/door locking functionality (e.g., receive user inputs from a portable electronic device to actuate bolt of the smart door lock 120), announce a person's approach or departure via audio or visual means, and/or control settings on a security system (e.g., to activate or deactivate the security system when occupants go and come).

The smart alarm system 122 may detect the presence of an individual within close proximity (e.g., using built-in IR sensors), sound an alarm (e.g., through a built-in speaker, or by sending commands to one or more external speakers), and send notifications to entities or users within/outside of the smart home network 100. In some implementations, the smart alarm system 122 also includes one or more input devices or sensors (e.g., keypad, biometric scanner, NFC transceiver, microphone) for verifying the identity of a user, and one or more output devices (e.g., display, speaker). In some implementations, the smart alarm system 122 may also be set to an "armed" mode, such that detection of a trigger condition or event causes the alarm to be sounded unless a disarming action is performed.

In some implementations, the smart home environment 100 includes one or more intelligent, multi-sensing, network-connected wall switches 108 (hereinafter referred to as "smart wall switches 108"), along with one or more intelligent, multi-sensing, network-connected wall plug interfaces 110 (hereinafter referred to as "smart wall plugs 110"). The smart wall switches 108 may detect ambient lighting conditions, detect room-occupancy states, and control a power and/or dim state of one or more lights. In some instances, smart wall switches 108 may also control a power state or speed of a fan, such as a ceiling fan. The smart wall plugs 110 may detect occupancy of a room or enclosure and control supply of power to one or more wall plugs (e.g., such that power is not supplied to the plug if nobody is at home).

In some implementations, the smart home environment 100 of FIG. 1 includes a plurality of intelligent, multi-sensing, network-connected appliances 112 (hereinafter referred to as "smart appliances 112"), such as refrigerators, stoves, ovens, televisions, washers, dryers, lights, stereos, intercom systems, garage-door openers, floor fans, ceiling fans, wall air conditioners, pool heaters, irrigation systems, security systems, space heaters, window AC units, motorized duct vents, and so forth. In some implementations, when plugged in, an appliance may announce itself to the smart home network, such as by indicating what type of appliance it is, and it may automatically integrate with the controls of the smart home. Such communication by the appliance to the smart home may be facilitated by either a wired or wireless communication protocol. The smart home may also include a variety of non-communicating legacy appliances 140, such as old conventional washer/dryers, refrigerators, and the like, which may be controlled by smart wall plugs 110. The smart home environment 100 may further include a variety of partially communicating legacy appliances 142, such as infrared ("IR") controlled wall air conditioners or other IR-controlled devices, which may be controlled by IR signals provided by the smart hazard detectors 104 or the smart wall switches 108.

In some implementations, the smart home environment 100 includes one or more network-connected cameras 118 that are configured to provide video monitoring and security in the smart home environment 100. The cameras 118 may be used to determine occupancy of the structure 150 and/or particular rooms 152 in the structure 150, and thus may act as occupancy sensors. For example, video captured by the cameras 118 may be processed to identify the presence of an occupant in the structure 150 (e.g., in a particular room 152). Specific individuals may be identified based, for example, on their appearance (e.g., height, face) and/or movement (e.g., their walk/gait). The cameras 118 optionally include one or more sensors (e.g., IR sensors, radar systems, motion detectors), input devices (e.g., microphone for capturing audio), and output devices (e.g., speaker for outputting audio).

The smart home environment 100 may additionally or alternatively include one or more other occupancy sensors (e.g., the smart doorbell 106, smart door locks 120, touch screens, IR sensors, microphones, ambient light sensors, motion detectors, smart nightlights 170, etc.). In some implementations, the smart home environment 100 includes radio-frequency identification (RFID) readers (e.g., in each room 152 or a portion thereof) that determine occupancy based on RFID tags located on or embedded in occupants. For example, RFID readers may be integrated into the smart hazard detectors 104.

The smart home environment 100 may also include communication with devices outside of the physical home but within a proximate geographical range of the home. For example, the smart home environment 100 may include a pool heater monitor 114 that communicates a current pool temperature to other devices within the smart home environment 100 and/or receives commands for controlling the pool temperature. Similarly, the smart home environment 100 may include an irrigation monitor 116 that communicates information regarding irrigation systems within the smart home environment 100 and/or receives control information for controlling such irrigation systems.

In some implementations, the smart home environment 100 includes one or more electronic tags that are configured to communicate with one or more smart devices via radar. In some implementations, the electronic tags are affixed to an object such as a window, door, or wall and are configured to impart a radar signature for the object. In some implementations, the electronic tags are affixed to an entity, such as a pet, and are configured to impart a radar signature for the entity. In some implementations, the electronic tags are configured to communicate via multiple wavelengths and/or protocols. For example a particular electronic tag is configured to communicate via RFID as well as via radar. In some implementations, a smart device, such as any of the smart devices discussed previously, includes a radar module for detecting the presence, direction, distance, and/or speed of objects, by sending out pulses of high-frequency electromagnetic waves that are reflected off the object back to the source. In some implementations, a smart device further includes a communications module, distinct from the radar module, for communicating with other smart devices and/or the electronic tags (e.g., via RFID, Wi-Fi, Bluetooth, and the like).

By virtue of network connectivity, one or more of the smart home devices of FIG. 1 may further allow a user to interact with the device even if the user is not proximate to the device. For example, a user may communicate with a device using a client device such as a computer (e.g., a desktop computer, laptop computer, or tablet) or other portable electronic device (e.g., a mobile phone, such as a smart phone). A webpage or application may be configured to receive communications from the user and control the device based on the communications and/or to present information about the device's operation to the user. For example, the user may view a current set point temperature for a device (e.g., a stove) and adjust it using a computer. The user may be in the structure during this remote communication or outside the structure.

As discussed above, users may control smart devices in the smart home environment 100 using a client device, for example, a network-connected computer or portable electronic device. In some examples, some or all of the occupants (e.g., individuals who live in the home) may register their device with the smart home environment 100. Such registration may be made at a central server to authenticate the occupant and/or the device as being associated with the home and to give permission to the occupant to use the device to control the smart devices in the home. An occupant may use their registered device to remotely control the smart devices of the home, such as when the occupant is at work or on vacation. The occupant may also use their registered device to control the smart devices when the occupant is actually located inside the home, such as when the occupant is sitting on a couch inside the home. It should be appreciated that instead of or in addition to registering devices, the smart home environment 100 may make inferences about which individuals live in the home and are therefore occupants and which devices are associated with those individuals. As such, the smart home environment may "learn" who is an occupant and permit the devices associated with those individuals to control the smart devices of the home.

In some implementations, in addition to containing processing and sensing capabilities, devices 102, 104, 106, 108, 110, 112, 114, 116, 118, 120, and/or 122 (collectively referred to as "the smart devices") are capable of data communications and information sharing with other smart devices, a central server or cloud-computing system, and/or other devices that are network-connected. Data communications may be carried out using any of a variety of custom or standard wireless protocols (e.g., IEEE 802.15.4, Wi-Fi, ZigBee, 6LoWPAN, Thread, Z-Wave, Bluetooth Smart, ISA100.11a, WirelessHART, MiWi, etc.) and/or any of a variety of custom or standard wired protocols (e.g., Ethernet, HomePlug, etc.), or any other suitable communication protocol, including communication protocols not yet developed as of the filing date of this document.

In some implementations, the smart devices communicate via radar. In some implementations, the smart devices communicate with one or more electronic tags via radar. In some implementations, the smart devices communicate with one another and/or with electronic tags using a plurality of communication channels, such as RFID and radar. In some implementations, the smart devices communicate via one or more radio frequency bands, such as 3-10 GHz, 24-24.5 GHz, 57-64 GHz, and/or 77-81 GHz.

In some implementations, the smart devices serve as wireless or wired repeaters. In some implementations, a first one of the smart devices communicates with a second one of the smart devices via a wireless router. The smart devices may further communicate with each other via a connection (e.g., network interface 160) to a network, such as the Internet 162. Through the Internet 162, the smart devices may communicate with a smart home provider server system 190 (also called a central server system and/or a cloud-computing system herein). The smart home provider server system 190 may be associated with a manufacturer, support entity, or service provider associated with the smart device (s). In some implementations, a user is able to contact customer support using a smart device itself rather than needing to use other communication means, such as a telephone or Internet-connected computer. In some implementations, software updates are automatically sent from the smart home provider server system 190 to smart devices (e.g., when available, when purchased, or at routine intervals).

In some implementations, the network interface 160 includes a conventional network device (e.g., a router), and the smart home environment 100 of FIG. 1 includes a hub device 180 that is communicatively coupled to the network (s) 162 directly or via the network interface 160. The hub device 180 is further communicatively coupled to one or more of the above intelligent, multi-sensing, network-connected devices (e.g., smart devices of the smart home environment 100). Each of these smart devices optionally communicates with the hub device 180 using one or more radio communication networks available at least in the smart home environment 100 (e.g., ZigBee, Z-Wave, Insteon, Bluetooth, Wi-Fi and other radio communication networks). In some implementations, the hub device 180 and devices coupled with/to the hub device can be controlled and/or interacted with via an application (sometimes called a smart home application) running on a client device, for example, a smart phone, household controller, laptop, tablet computer, game console or similar electronic device. In some implementations, a user of such controller application can view status of the hub device or coupled smart devices, configure the hub device to interoperate with smart devices newly introduced to the home network, commission new smart devices, and adjust or view settings of connected smart devices, etc. In some implementations the hub device extends capabilities of low capability smart device to match capabilities of the highly capable smart devices of the same type, integrates functionality of multiple different device types—even across different communication protocols, and is configured to streamline adding of new devices and commissioning of the hub device. In some implementations, hub device 180 further comprises a local storage device for storing data related to, or output by, smart devices of smart home environment 100. In some implementations, the data includes one or more of: video data output by a camera device, metadata output by a smart device, settings information for a smart device, usage logs for a smart device, and the like.

In some implementations, smart home environment 100 includes a local storage device for storing data related to, or output by, smart devices of smart home environment 100. In some implementations, the data includes one or more of: video data output by a camera device (e.g., camera 118), metadata output by a smart device, settings information for a smart device, usage logs for a smart device, and the like. In some implementations, the local storage device is communicatively coupled to one or more smart devices via a smart home network (e.g., smart home network 202, FIG. 2). In some implementations, the local storage device is selectively coupled to one or more smart devices via a wired and/or wireless communication network. In some implementations, the local storage device is used to store video data when external network conditions are poor. For example, the local storage device is used when an encoding bitrate of camera 118 exceeds the available bandwidth of the external network (e.g., network(s) 162). In some implementations, the local storage device temporarily stores video data from one or more cameras (e.g., camera 118) prior to transferring the video data to a server system. In some implementations, the local storage device is a component of a camera device. In some implementations, each camera device includes a local storage.

It is to be appreciated that "smart home environments" may refer to smart environments for homes such as a single-family house, but the scope of the present teachings is not so limited. The present teachings are also applicable, without limitation, to duplexes, townhomes, multi-unit apartment buildings, hotels, retail stores, office buildings, industrial buildings or other structures, and more generally any living space or work space.

It is also to be appreciated that while the terms user, customer, installer, homeowner, occupant, guest, tenant, landlord, repair person, and the like may be used to refer to the person or persons acting in the context of some particularly situations described herein, these references do not limit the scope of the present teachings with respect to the person or persons who are performing such actions. Thus, for example, the terms user, customer, purchaser, installer, subscriber, and homeowner may often refer to the same person in the case of a single-family residential dwelling, because the head of the household is often the person who makes the purchasing decision, buys the unit, and installs and configures the unit, and is also one of the users of the unit. However, in other scenarios, such as a landlord-tenant environment, the customer may be the landlord with respect to purchasing the unit, the installer may be a local apartment supervisor, a first user may be the tenant, and a second user may again be the landlord with respect to remote control functionality. Importantly, while the identity of the person performing the action may be germane to a particular advantage provided by one or more of the implementations, such identity should not be construed in the descriptions that follow as necessarily limiting the scope of the present teachings to those particular individuals having those particular identities.

Figure 2:
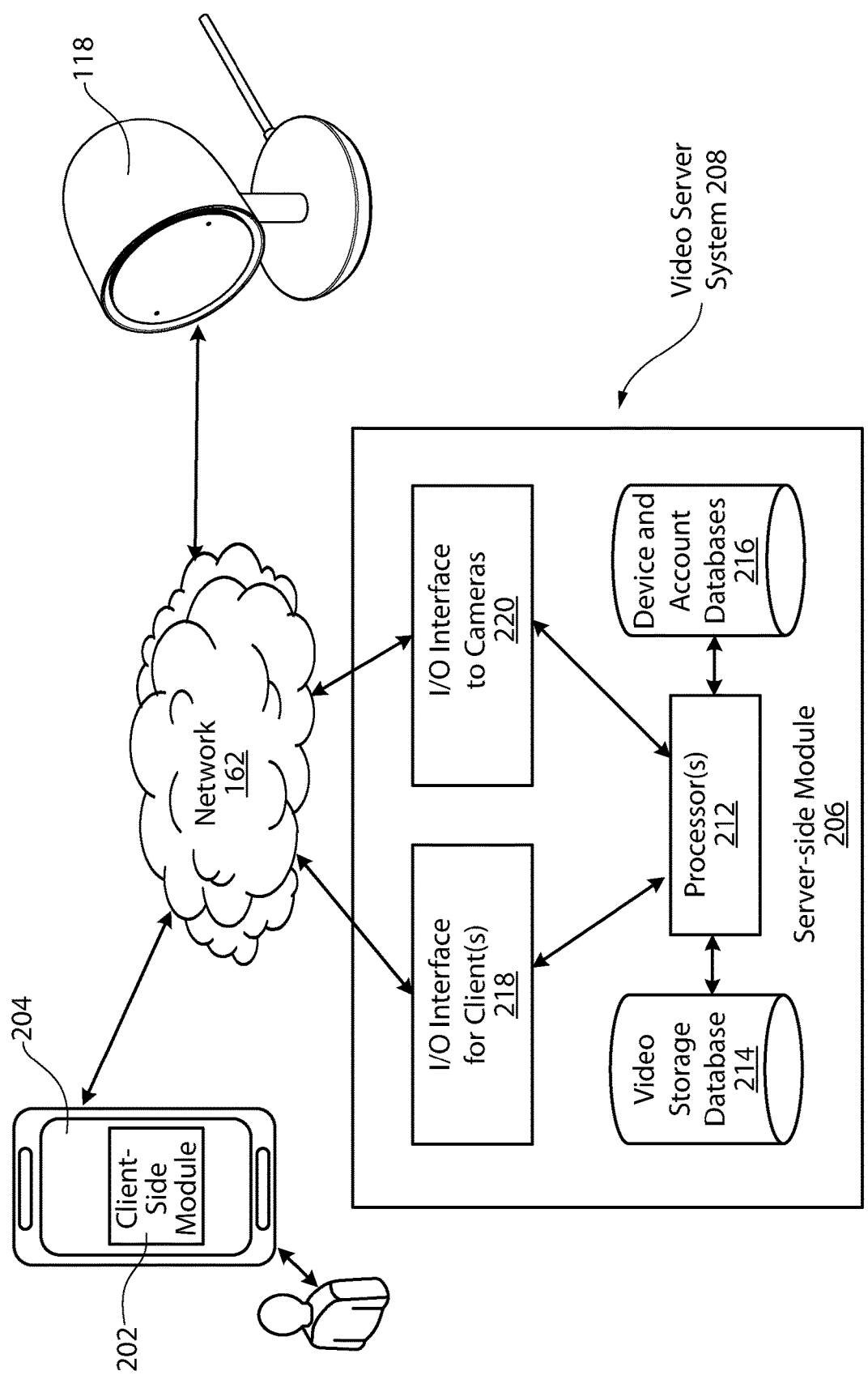
FIG. 2 is a representative operating environment in which a server system interacts with client devices and hub devices communicatively coupled to a camera, in accordance with some implementations.

As shown in FIG. 2, in accordance with some implementations, each of the client devices 204 includes a client-side module 202. The client-side module 202 communicates with a server-side module 206 executed on the server system 208 through the one or more networks 162. The client-side module 202 provides client-side functionalities for the event monitoring and review processing and communications with the server-side module 206. The server-side module 206 provides server-side functionalities for event monitoring and review processing for any number of client-side modules 202 each residing on a respective client device 204. The server-side module 206 also provides server-side functionalities for video processing and camera control for any number of the video sources, including any number of control devices and the cameras 118.

In some implementations, the server-side module 206 includes one or more processors 212, a video storage database 214, device and account databases 216, an I/O interface to one or more client devices 218, and an I/O interface to one or more video sources 220. The I/O interface to one or more clients 218 facilitates the client-facing input and output processing for the server-side module 206. The databases 216 store a plurality of profiles for reviewer accounts registered with the video processing server, where a respective user profile includes account credentials for a respective reviewer account, and one or more video sources linked to the respective reviewer account. The I/O interface to one or more video sources 220 facilitates communications with one or more video sources (e.g., groups of one or more cameras 118 and associated controller devices). The video storage database 214 stores raw video data received from the video sources, as well as various types of metadata, such as motion events, event categories, event category models, event filters, and event masks, for use in data processing for event monitoring and review for each reviewer account.

Examples of a representative client device 204 include, but are not limited to, a handheld computer, a wearable computing device, a personal digital assistant (PDA), a tablet computer, a laptop computer, a desktop computer, a cellular telephone, a smart phone, an enhanced general packet radio service (EGPRS) mobile phone, a media player, a navigation device, a game console, a television, a remote control, a point-of-sale (POS) terminal, vehicle-mounted computer, an ebook reader, or a combination of any two or more of these data processing devices or other data processing devices.

Examples of the one or more networks 162 include local area networks (LAN) and wide area networks (WAN) such as the Internet. The one or more networks 162 are, optionally, implemented using any known network protocol, including various wired or wireless protocols, such as Ethernet, Universal Serial Bus (USB), FIREWIRE, Long Term Evolution (LTE), Global System for Mobile Communications (GSM), Enhanced Data GSM Environment (EDGE), code division multiple access (CDMA), time division multiple access (TDMA), Bluetooth, Wi-Fi, voice over Internet Protocol (VoIP), Wi-MAX, or any other suitable communication protocol.

In some implementations, the server system 208 is implemented on one or more standalone data processing apparatuses or a distributed network of computers. In some implementations, the server system 208 also employs various virtual devices and/or services of third party service providers (e.g., third-party cloud service providers) to provide the underlying computing resources and/or infrastructure resources of the server system 208. In some implementations, the server system 508 includes, but is not limited to, a handheld computer, a tablet computer, a laptop computer, a desktop computer, or a combination of any two or more of these data processing devices or other data processing devices.

The server-client environment shown in FIG. 2 includes both a client-side portion (e.g., the client-side module 202) and a server-side portion (e.g., the server-side module 206). The division of functionalities between the client and server portions of operating environment can vary in different implementations. Similarly, the division of functionalities between the video source (e.g., camera 118) and the server system 208 can vary in different implementations. For example, in some implementations, client-side module 202 is a thin-client that provides only user-facing input and output processing functions, and delegates all other data processing functionalities to a backend server (e.g., the server system 208). Similarly, in some implementations, a respective one of the video sources (e.g., camera 118) is a simple video capturing device that continuously captures and streams video data to the server system 208 without no or limited local preliminary processing on the video data. Although many aspects of the present technology are described from the perspective of the server system 208, the corresponding actions performed by the client device 204 and/or the video sources would be apparent to ones skilled in the art without any creative efforts. Similarly, some aspects of the present technology may be described from the perspective of the client device or the video source, and the corresponding actions performed by the video server would be apparent to ones skilled in the art without any creative efforts. Furthermore, some aspects of the present technology may be performed by the server system 208, the client device 204, and the video sources cooperatively.

It should be understood that operating environment that involves the server system 208 and the cameras 118 is merely an example. Many aspects of operating environment are generally applicable in other operating environments in which a server system provides data processing for monitoring and facilitating review of data captured by other types of electronic devices (e.g., smart thermostats 102, smart hazard detectors 104, smart doorbells 106, smart wall plugs 110, appliances 112 and the like).

The electronic devices, the client devices or the server system communicate with each other using the one or more communication networks 162. In an example smart home environment, two or more devices (e.g., the network interface device 160, the hub device 180, and the client devices 204) are located in close proximity to each other, such that they could be communicatively coupled in the same sub-network via wired connections, a WLAN or a Bluetooth Personal Area Network (PAN). The Bluetooth PAN is optionally established based on classical Bluetooth technology or Bluetooth Low Energy (BLE) technology. This smart home environment further includes one or more other radio communication networks through which at least some of the electronic devices of the video sources exchange data with the hub device 180. Alternatively, in some situations, some of the electronic devices of the video sources (e.g., cameras 118) communicate with the network interface device 160 directly via the same sub-network that couples devices 160, 180 and 204. In some implementations (e.g., in the network 162C), both the client device 204 and cameras 118 communicate directly via the network(s) 162 without passing the network interface device 160 or the hub device 180.

Figure 3:
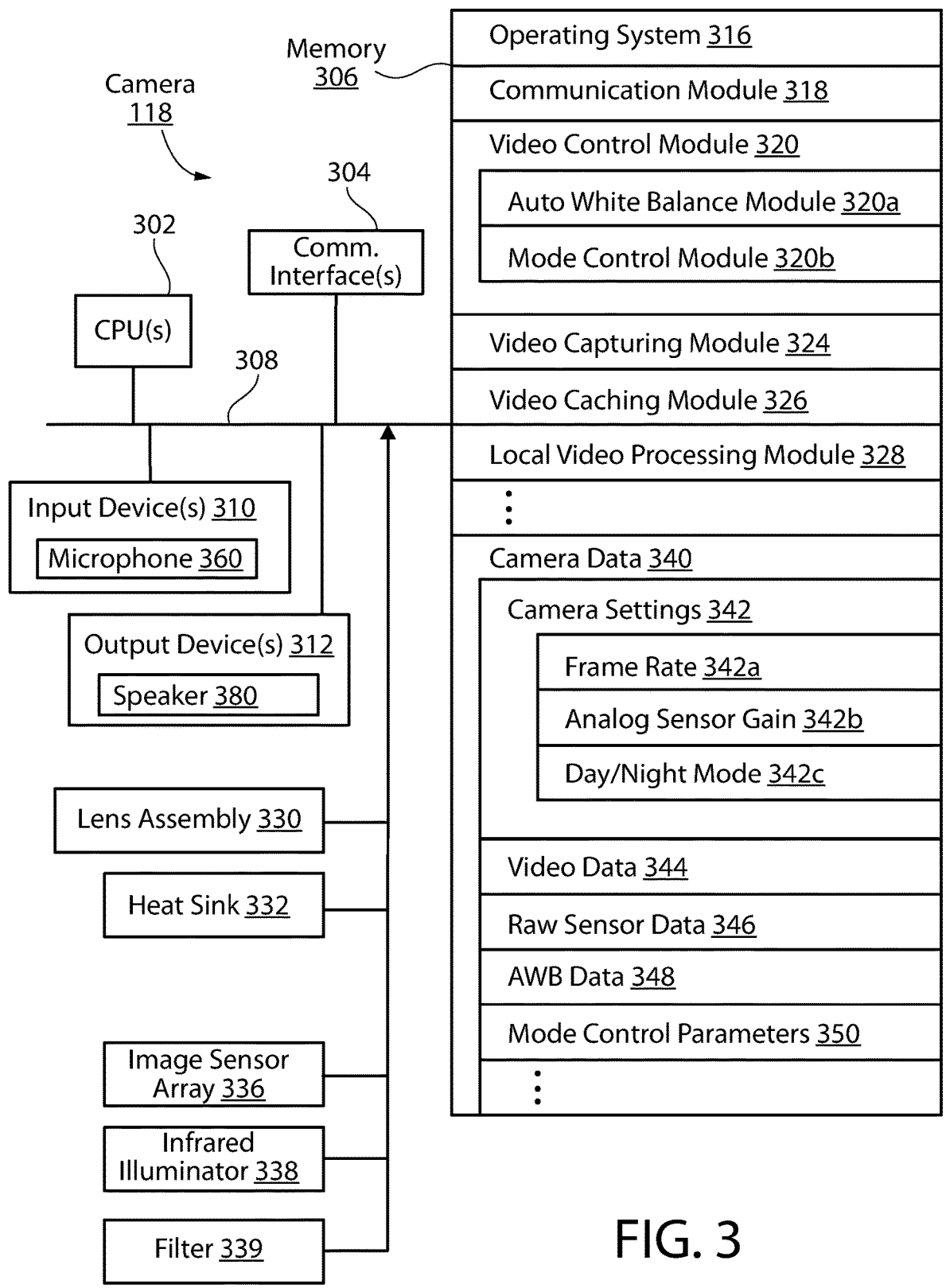
FIG. 3 is a block diagram illustrating a representative camera device, in accordance with some implementations.

As shown in FIG. 3, each camera 118 according to some implementations may include one or more processing units (e.g., CPUs) 302, one or more communication interfaces 304, memory 306, and one or more communication buses 308 for interconnecting these components. In some implementations, camera 118 includes one or more input devices 310, for example, a microphone 360 for receiving audio input. In some implementations, camera 118 includes one or more output devices 312, for example, a speaker 380. In further implementations, camera 118 includes one or more lens assemblies 330 for receiving and focusing light onto one or more image sensor arrays 336. Camera 118, in some implementations, may also include one or more heat sinks 332 for dissipating heat from camera 118 or its components (e.g., CPU 302), one or more infrared illuminators 338 to assisting with focusing, and one or more filters 339 such as filters for blocking certain wavelengths of light (e.g., UV-light, infrared light).

Stored in memory 306 of camera 118 is an operating system 316 which includes procedures for handling various system services and performing hardware dependent tasks according to some implementations. In some implementations, memory 306 also contain various modules, for example, a communication module 318 for connecting camera 118 to other systems and devices (e.g., client devices, electronic devices, and systems connected to one or more networks 162 in FIGS. 1 and 2), video control module 320 including an auto white balance module 320a and a mode control module 320b, a video capturing module 324, a video caching module 326, and a local video processing module 328. In further implementations, memory 306 also stores camera data 340 such as camera settings 342 (e.g., frame rate 342a, analog sensor gain 342b, day/night mode 342c), video data 344, raw sensor data 346, AWB data 348, and mode control parameters 350.

In certain implementations, an electronic device such as camera 118 may be mounted onto a stand assembly which provides a physical support for the electronic device. A stand assembly in accordance with certain implementations of the present invention is configured to provide one or more degrees of freedom to the electronic device. In some implementations, the stand assembly is particularly configured to allow the electronic device mounted thereon to tilt and/or rotate to enable a user to aim the electronic device towards different directions. In further implementations, the stand assembly provides an electrical connection between the electronic device mounted thereon and a second device, for example, a separate power source, computer, portable electronic device, etc., to allow for communication between the electronic device and the second device.

FIGS. 4A-6 illustrate a system 400, which may be a camera system according to some implementations, which includes a stand assembly 402 having a head portion 500 mounted thereon which is or includes an electronic device. In some implementations, head portion 500 is or includes a camera, such as camera 118, which is configured to capture video and/or still photographs. In some implementations, system 400 may be used as a component of a residential or commercial surveillance system, for example. In some implementations, head portion 500 additionally or alternatively includes an audio device (e.g., speaker, microphone). In further implementations, head portion 500 additionally or alternatively includes a light source (e.g., light bulb, light emitting diodes, laser, etc.). Other electronic devices may also be included in head portion 500 according to further implementations.

Head portion 500, in some implementations, includes a housing 502 which surrounds and protects the internal components of the electronic device. In some implementations where head portion 500 is or includes camera 118, the various components of camera 118 (e.g., CPU(s) 302, memory 306, input device(s) 310, output device(s) 312, lens assemblies 330, heat sink(s) 332, image sensor array(s) 336, infrared illuminator 338, filter(s) 339, etc.) may be enclosed within housing 502. In some implementations, housing 502 may include a generally cup-shaped shell which surrounds and defines an interior space in which the electronic device or components thereof may be housed. Housing 502 may have a continuously convexly curved exterior surface which defines an exterior surface of head portion 500. In some implementations, housing 502 may be bell-shaped or include a shape such as a circular paraboloid. Other shapes for housing 502 may also be utilized according to alternatively implementations. In some implementations, housing 502 includes an opening at or proximate a front end of housing 502 to allow insertion of components of the electronic device into housing 502.

Figure 5A:
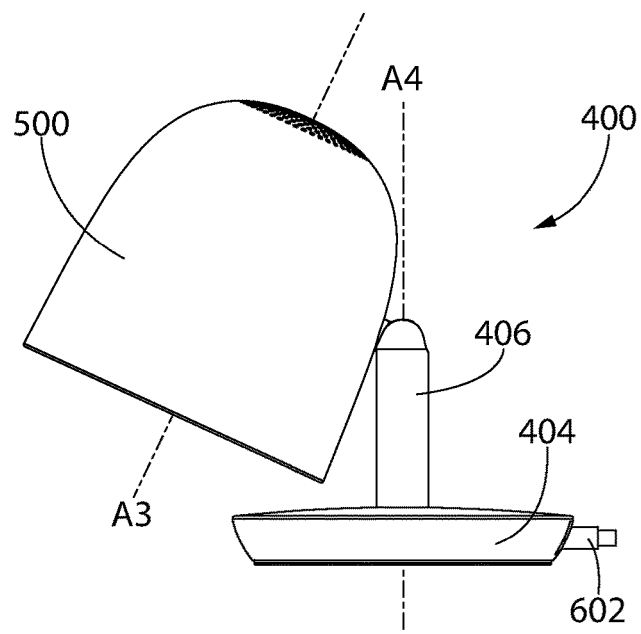
FIG. 5A shows a left side view of the system of FIG. 4A where the system is in a forward orientation, in accordance with some implementations.
Figure 5B:
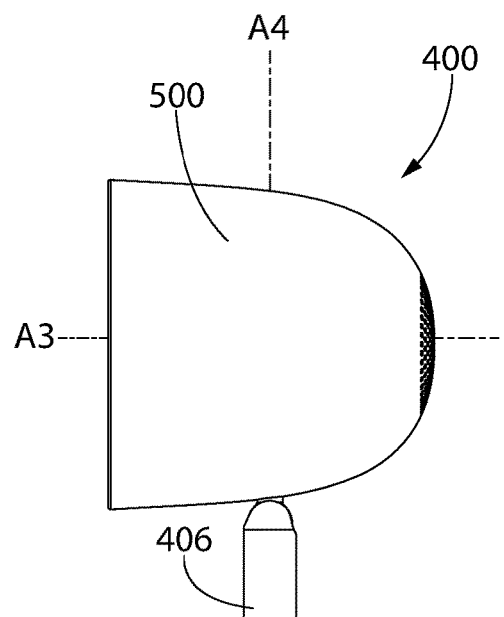
FIG. 5B shows a left side view of the system of FIG. 4A where the system is in a nominal position, in accordance with some implementations.
Figure 5C:
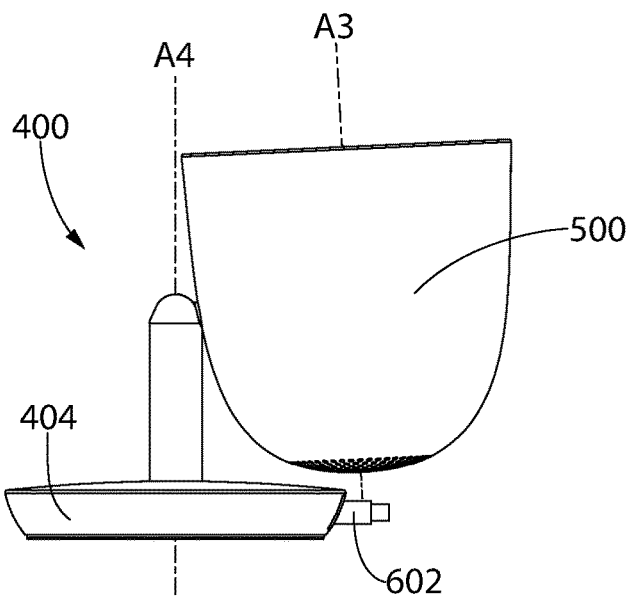
FIG. 5C shows a left side view of the system of FIG. 4A where the system is in a backward orientation, in accordance with some implementations.
Figure 5E:
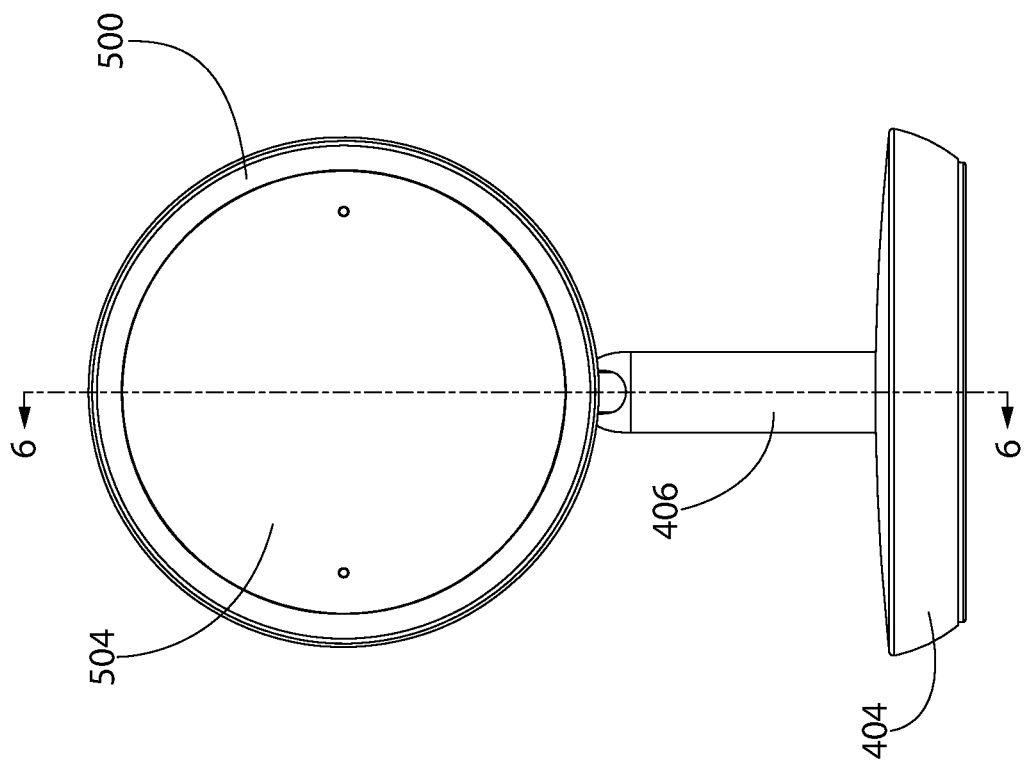
FIG. 5E shows a front elevational view of the system of FIG. 5B, in accordance with some implementations.
Figure 5D:
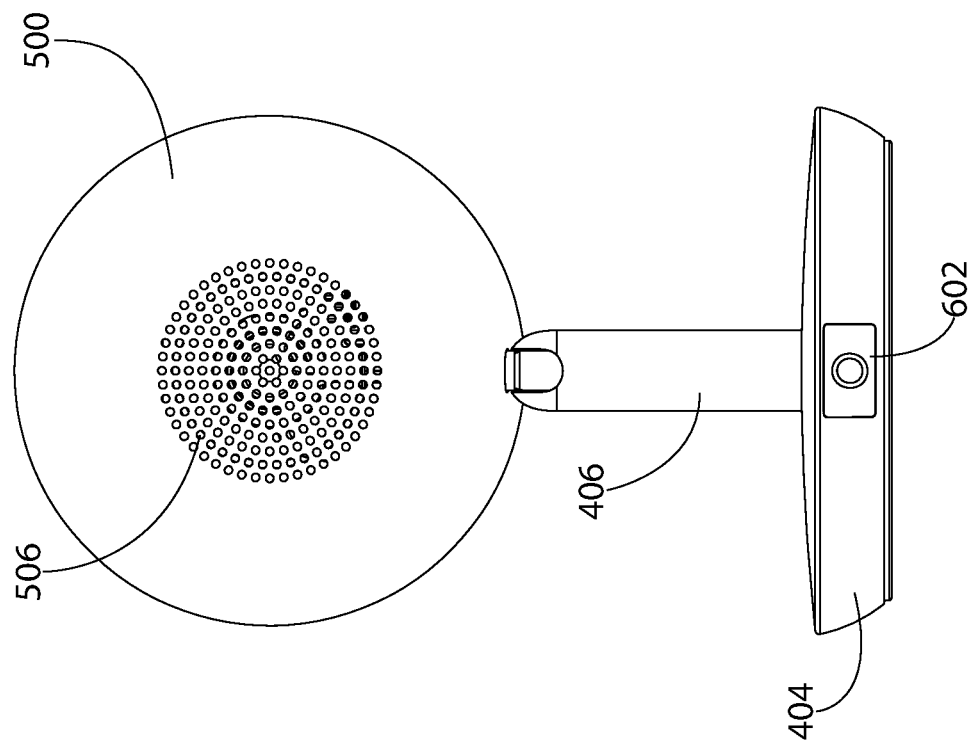
FIG. 5D shows a rear elevational view of the system of FIG. 5B, in accordance with some implementations.
Figure 6:
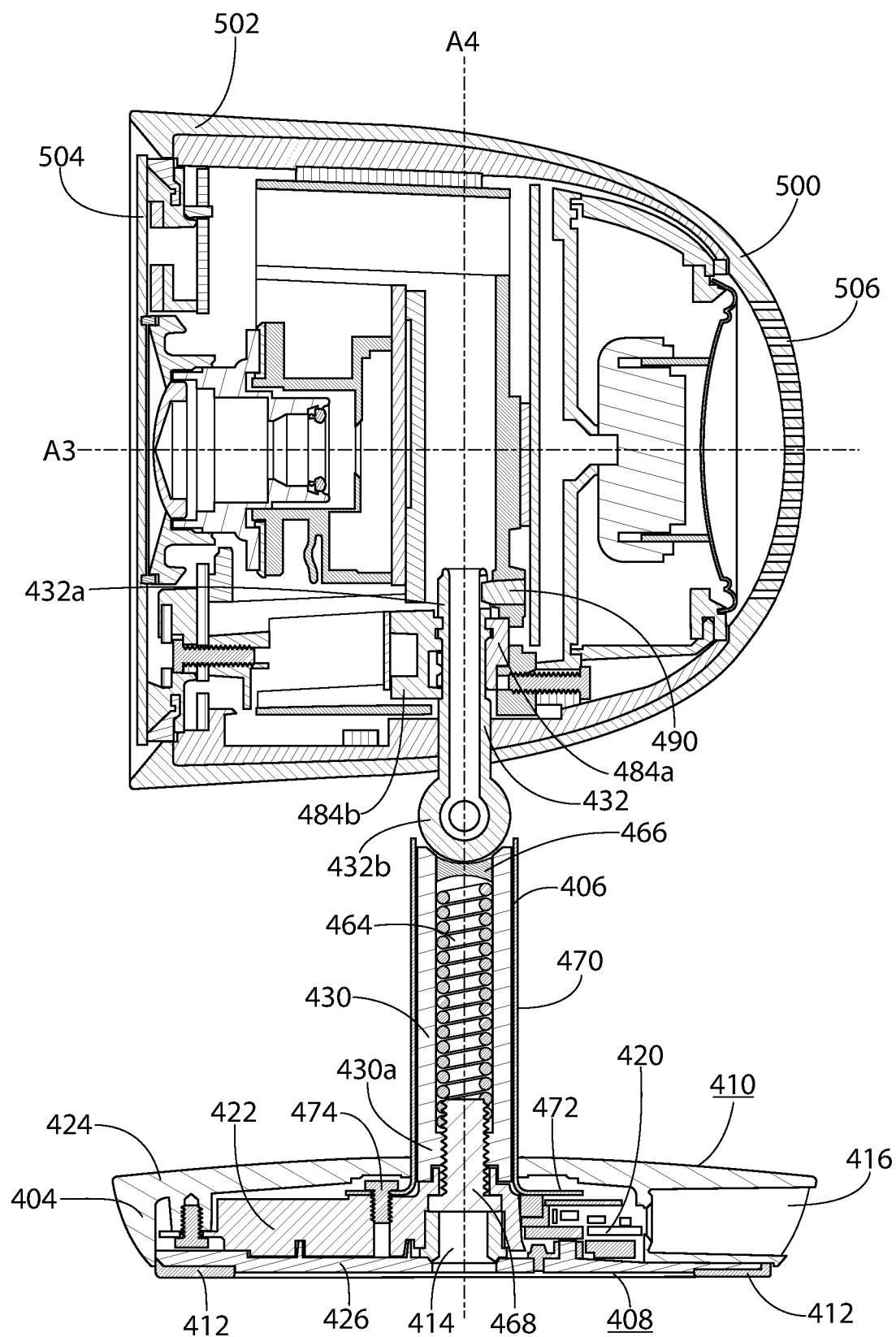
FIG. 6 is a cross-sectional view of the system taken along the plane designated by line 6-6 of FIG. 5E, in accordance with some implementations.

In some implementations, housing 502 may include a shape that is generally symmetric about an axis A3 of head portion 500 (FIGS. 5A-6). Where head portion 500 includes camera 118, axis A3, in some implementations, may represent an optical axis of camera 118. In some implementations, head portion 500 further includes a front element 504 which is sized and shaped to fit or substantially fill the opening at the front end of housing 502. In some implementations, where head portion 500 is or includes camera 118, front element 504 may be positioned at a front end of camera 118 and be positioned to face the subject being videoed and/or photographed by camera 118 during use. Front element 504 may be, in some implementations, include a circular disc of solid transparent material, for example, glass or transparent plastic. In some implementations, front element 504 is an optical lens element of camera 118. In some implementations, front element 504 may be provided with one or more coatings or layers, for example, a scratch-resistant coating, anti-glare coating, anti-reflective coating, etc. In further implementations, housing 502 includes a back end 506 opposite of front element 504. Back end 506, in some implementations, has a convexly curved exterior surface. In some implementations, back end 506 includes a speaker and/or microphone grille to allow transmission of sound to and from the electronic device in head portion 500. In some implementations, axis A3 extends from back end 506 to front element 504. In some implementations, axis A3 extends from a center of back end 506 to a center of front element 504.

Figure 4A:
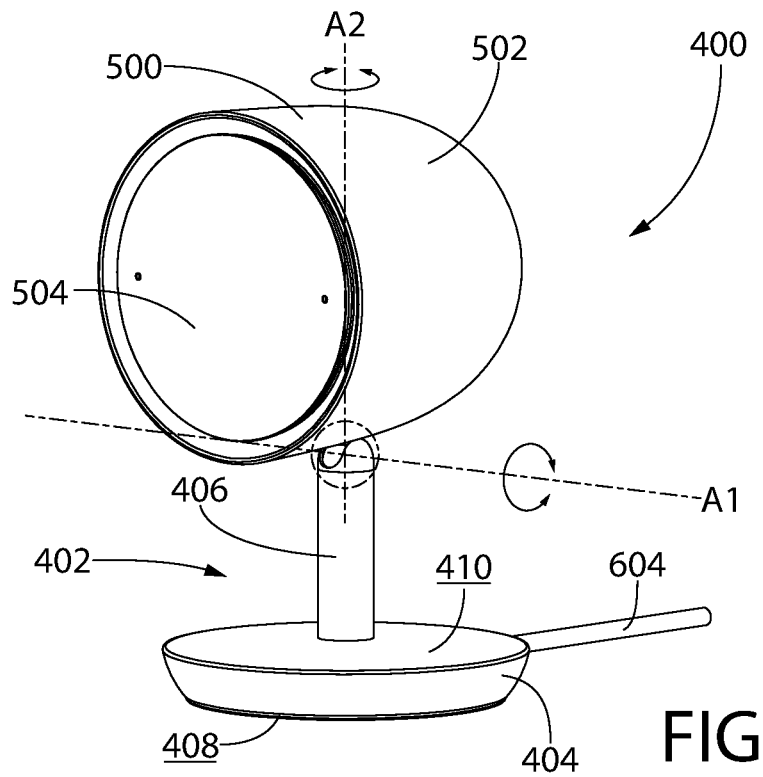
FIG. 4A shows a left, front perspective view of a system including an electronic device (e.g., a camera) mounted onto a stand assembly, in accordance with some implementations.
Figure 4B:
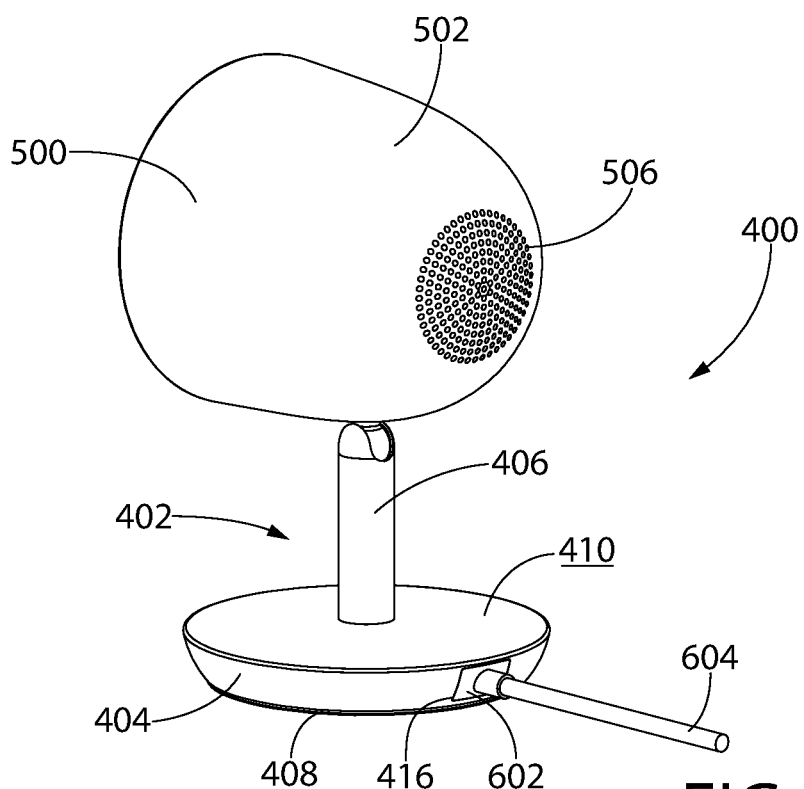
FIG. 4B shows a left, rear perspective view of the system of FIG. 4A.

Stand assembly 402, in some implementations, includes a base portion 404 for positioning onto a supporting surface and a stem portion 406 attached to base portion 404 which connects base portion 404 to head portion 500. In some implementations, as will be described in further detail below, stem portion 406 further defines a passageway for an electrical connection between the electronic device of head portion 500 (e.g., camera 118) and base portion 404. In some implementations, stand assembly 402 is configured to allow head portion 500 to move with respect to base portion 404 in at least one degree of freedom. In some implementations, stand assembly 402 is configured to allow head portion 500 to move with respect to base portion 404 in at least two degrees of freedom. In some implementations, stand assembly 402 is configured to allow head portion 500 to move with respect to base portion 404 in only two degrees of freedom. In some implementations, stand assembly 402 is configured to allow head portion 500 to move with respect to base portion 404 in a first rotational degree of freedom and a second rotational degree of freedom. With reference to FIG. 4A, in some implementations stand assembly 402 is configured to allow head portion 500 to move with respect to base portion 404 in a first rotational degree of freedom (e.g., forward-backward tilting or "pitch") about axis A1, and a second rotational degree of freedom (e.g., side-to-side twisting or "yaw") about axis A2. In some implementations, the first and second rotational degrees of freedom define one or more angles of view for a field of view of the electronic device of head portion 500 (e.g., camera 118). Axis A1, in some implementations, may be generally parallel to a bottom surface 408 of base portion 404. In some implementations, stem portion 406 includes a neck portion 432 having a first end that is rotatably connected to head portion 500 to provide one rotational degree of freedom (yaw) and having a second end that is rotatably connected to a spine portion 430 to provide another rotational degree of freedom (pitch). In some implementations, each degree of freedom allows rotation about a single axis. In some implementations, the axes of rotation are oriented perpendicular to each other when system 400 is in a nominal position. In some implementations, a rotational degree of freedom is associated with twisting of the head portion 500 or electronic device with respect to a twisting axis (axis A2) that passes through a central axis of the neck portion 432.

FIGS. 5A-5E illustrate a range of motion of the forward-backward tilting (pitching) of head portion 500 with respect to base portion 404 according to some implementations. For the purpose of these illustrations, axis A4 represents a central vertical axis which may be, for example, generally perpendicular to a bottom surface of base portion 404. In some implementations, axis A4 is coaxial with a central long axis of spine portion 430. FIG. 5B shows a side view of system 400 in a first nominal position where axis A3 of head portion 500 (e.g., the optical axis of camera 118) is generally horizontal, and is perpendicular to axis A4. In some implementations, axis A3 is parallel with the bottom surface of base portion 404 when system 400 is in the first nominal position. FIGS. 5D and 5E respectively show rear and front views of system 400 in the first nominal position. In some implementations, spine portion 430 and neck portion 432 are substantially aligned (e.g., coaxial about axis A4) when system 400 is in the first nominal position. In some implementations, a range of motion of head portion 500 includes a tilting range that is about or equal to 180 degrees and substantially symmetric with respect to the first nominal position (e.g., plus or minus 90 degrees from the nominal position). FIG. 5A shows head portion 500 in a forward tilting position with respect to base portion 404. In some implementations, head portion 500 is able to tilt forward from 0 degrees to about 45 degrees from the nominal position. In some implementations, head portion 500 is able to tilt forward from 0 degrees to about 50 degrees from the nominal position. In some implementations, head portion 500 is able to tilt forward from 0 degrees to about 55 degrees from the nominal position. In some implementations, head portion 500 is able to tilt forward from 0 degrees to about 60 degrees from the nominal position. In some implementations, head portion 500 is able to tilt forward from 0 degrees to about 65 degrees from the nominal position. In some implementations, head portion 500 is able to tilt forward from 0 degrees to about 70 degrees from the nominal position. In some implementations, head portion 500 is able to tilt forward from 0 degrees to about 75 degrees from the nominal position. In some implementations, head portion 500 is able to tilt forward from 0 degrees to about 80 degrees from the nominal position. In some implementations, head portion 500 is able to tilt forward from 0 degrees to about 85 degrees from the nominal position. In some implementations, head portion 500 is able to tilt forward less than 90 degrees from the nominal position. In some implementations, the forward tilting of head portion 500 may be limited when housing 502 of head portion 500 abuts stem portion 406. In some implementations, the forward tilting of head portion 500 may be limited when neck portion 432 abuts another component of stem portion 406. In some implementations, head portion 500 is able to tilt forward to a position such that axis A4 does not intersect head portion 500.

FIG. 5C shows head portion 500 in a backward tilting position with respect to base portion 404. In some implementations, head portion 500 is able to tilt backward from 0 degrees to about 45 degrees from the nominal position. In some implementations, head portion 500 is able to tilt backward from 0 degrees to about 50 degrees from the nominal position. In some implementations, head portion 500 is able to tilt backward from 0 degrees to about 55 degrees from the nominal position. In some implementations, head portion 500 is able to tilt backward from 0 degrees to about 60 degrees from the nominal position. In some implementations, head portion 500 is able to tilt backward from 0 degrees to about 65 degrees from the nominal position. In some implementations, head portion 500 is able to tilt backward from 0 degrees to about 70 degrees from the nominal position. In some implementations, head portion 500 is able to tilt backward from 0 degrees to about 75 degrees from the nominal position. In some implementations, head portion 500 is able to tilt backward from 0 degrees to about 80 degrees from the nominal position. In some implementations, head portion 500 is able to tilt backward from 0 degrees to about 85 degrees from the nominal position. In some implementations, head portion 500 is able to tilt backward from 0 degrees to about 90 degrees from the nominal position. In some implementations, head portion 500 is able to tilt backwards to a greater degree than it is able to tilt forward. In some implementations, the backward tilting of head portion 500 may be limited when housing 502 of head portion 500 abuts stem portion 406. In some implementations, the backward tilting of head portion 500 may be limited when neck portion 432 abuts another component of stem portion 406. In some implementations, head portion 500 is able to tilt backward to a position such that axis A4 does not intersect head portion 500.

In some implementations, base portion 404 is sized and configured to sit or rest upon a supporting surface, for example, a surface of a floor, tabletop, desktop, shelf, or other support structure etc. In some implementations, base portion 404 is configured to sit on the supporting surface without having to be secured or fixed to the supporting surface. The intended supporting surface may be a generally horizontal surface in some implementations. In further implementations, base portion 404 may be configured to be secured onto a supporting surface, for example, via mechanical fasteners, adhesive, magnetic attachments, etc. In some implementations, base portion 404 may be configured to be mounted onto a non-horizontal supporting surface. In some implementations, stand assembly 402 additionally includes a mount structure (not shown) that is configured to be attached and fixed onto a supporting surface using one or more mount fasteners, and at least a part of the mount structure is made of magnetically attractable material, stand assembly 402 being mountable onto the supporting surface when base portion 404 is magnetically adhered onto the mount structure.

Figure 13A:
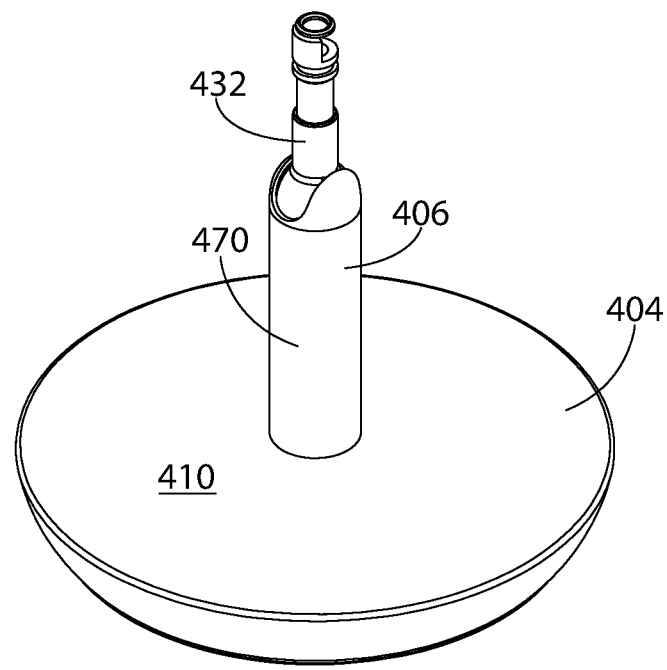
FIG. 13A is a top perspective view of the stand assembly of FIG. 9A, in accordance with some implementations.
Figure 13B:
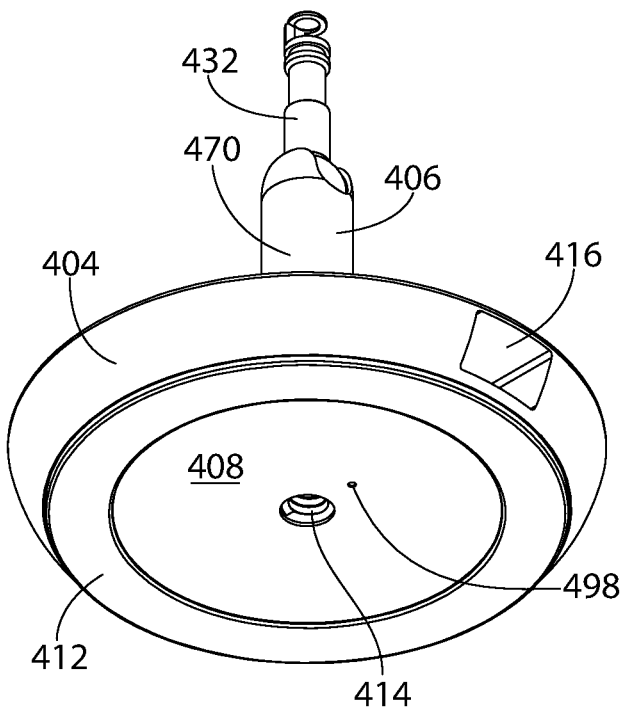
FIG. 13B is a bottom perspective view of the stand assembly of FIG. 13A, in accordance with some implementations.

Base portion 404 can have any suitable shape to support head portion 500. In some implementations, base portion 404 is sized and shaped to prevent tipping of system 400 throughout the entire range of motion of head portion 500 with respect to base portion 404. In some implementations, base portion 404 is sized and shaped to prevent tipping of system 400 when base portion 404 is positioned on a generally horizontal supporting surface without having to be secured to the supporting surface. In some implementations, base portion 404 has a broadest dimension that is equal to or larger than a broadest dimension of head portion 500. In other implementations, head portion 500 has a broadest dimension that is larger than a broadest dimension of base portion 404. In some implementations, head portion 500 is sufficiently spaced from base portion 404 (e.g., by stem portion 406) such that head portion 500 will not come into direct contact with base portion 404 throughout the full range of motion of head portion 500 with respect to base portion 404. In some implementations, base portion 404 may be, for example, generally shaped as a cylinder, a prism, a frustum, a truncated cone, a spherical segment, or other three-dimensional shape. As shown in FIGS. 6 and 13B, in some implementations base portion 404 has an exterior bottom surface 408 which is positioned to face the supporting surface and an exterior top surface 410 opposite the bottom surface 408. Bottom surface 408 may be a planar surface according to some implementations, and may be circular in shape as illustrated. Top surface 410 may also be planar or, in other implementations, may be curved. In some implementations, top surface 410 is parallel to bottom surface 408. In some implementations, top surface 410 has a broadest dimension (e.g., diameter) which is larger than a broadest dimension of bottom surface 408. In some implementations, bottom surface 408 is provided with one or more patches 412 arranged and configured to contact the supporting surface. In some implementations, the one or more patches 412 includes a non-slip or slip-resistant material to reduce the ability of base portion 404 to slide or shift on the supporting surface. In some implementations, the one or more patches 412 may also help protect the supporting surface from scratches caused by contact with base portion 404. In some implementations, the one or more patches 412 are constructed from an elastomer, for example, rubber, silicone, or thermoplastic elastomer. In one example implementation, the one or more patches 412 includes an elastomeric (e.g., rubber) ring that is attached to bottom surface 408. The one or more patches 412 may be, for example, molded with or onto bottom surface 408 or adhered to bottom surface 408 according to some implementations. In some implementations, base portion 404 includes one or more magnets (not shown) for attaching base portion 404 onto certain magnetic or metal supporting surfaces. The magnet, according to some implementations, may be disposed adjacent to or forms a portion of bottom surface 408. In some implementations, the magnet includes a magnetic plate which has a surface area less than the surface area of bottom surface 408. In further implementations, bottom surface 408 may be provided with one or more apertures that are each configured to receive a fastener to secure bottom surface 408 onto a supporting surface. In one such implementation, base portion 404 includes a threaded aperture 414 which is sized to receive and mate with a standard tripod screw (e.g., ¼-20 UNC [¼" diameter, 20 threads per inch] or ⅜-16 UNC [⅜" diameter, 16 threads per inch]) to allow stand assembly 402 to be mounted onto a tripod or quick-release tripod plate. In some implementations, threaded aperture 414 may be provided via a nut (e.g., a tripod nut) that is positioned in base portion 404 at or proximate the center of bottom surface 408 according to some implementations. In further implementations, bottom surface 408 may also be provided with a reset aperture 498 which provides access to a reset switch or button housed in base portion 404. For example, a user may be able to activate the reset switch or button through the insertion of a pin, wire, etc. through reset aperture 498. Activation of the reset switch or button, in some implementations, may cause the electronic device (e.g., camera device 118) contained in head portion 500 to revert to certain default settings (e.g., clear memory, delete modified settings, etc.).

In further implementations, base portion 404 is configured to electronically connect with an external electronic device (e.g., electronic power source, computer, portable electronic device, etc). In some implementations, base portion 404 further includes a port 416 that is sized and configured to receive an external connector, such as a plug 602. In some implementations, plug 602 is further connected via cable 604 to an external electronic device (not shown), for example, a power source, computer, portable electronic device, etc. Electronic signals (e.g., power signals, data signals) during use of camera system 400 can be transmitted between the separate external device and camera 118 through cable 604 and plug 602 according to some implementations. Plug 602, in some implementations, includes a universal serial bus (USB) connector, for example, a USB 2.0 plug, USB 3.0 plug, USB type-A plug, USB type-B plug, USB type-C plug, mini-USB plug, or micro-USB plug. In some implementations, plug 602 is a micro-USB plug. Port 416 includes an electronic connector 418 (FIG. 7) configured to mate with and form a connection interface with plug 602 when plug 602 is fully received within port 416 according to some implementations. For example, where plug 602 is a USB plug (e.g., micro-USB plug), port 416 includes an electronic connector 418 having a corresponding USB receptacle (e.g., micro-USB receptacle, USB type-C receptacle, etc.) configured to connect to the USB plug and allow electronic communication through the connection interface.

In some implementations, port 416 includes an opening that is positioned in a rim or sidewall of base portion 404 which extends between bottom surface 408 and top surface 410. Electronic connector 418, in some implementations, may be inset into a body of base portion 404 and exposed from a side or rim of base portion 404 through port 416. In some implementations, port 416 is positioned at a rear of base portion 404. In some implementations, when the neck portion 432 and spine portion 430 are substantially aligned and when the electronic device of head portion 500 is rotated to a second nominal position at the second degree of freedom of rotation, the electronic device of head portion 500 is configured to face towards a second nominal direction and the electronic connector 418 and port 416 is configured to face away from the second nominal direction. For example, in some implementations, electronic connector 418 may face in a rearward direction while head portion 500 faces a frontward direction in the second nominal direction. In some implementations, port 416 may be specifically sized such that plug 602 substantially fills all of port 416 when plug 602 is received within port 416. For example, in some implementations, port 416 has a size that is substantially the same as or slightly larger than the size of a micro-USB plug overmold or other standard plug overmold. In some implementations, a surface of plug 602 may be substantially flush with a surface of base portion 404 (e.g., rim or sidewall of base portion 404) when plug 602 is fully received within port 416. In some implementations, port 416 has an opening specifically sized and/or shaped to prevent the insertion of plugs which are not compatible with the electronic connector in port 416.

Figure 7:
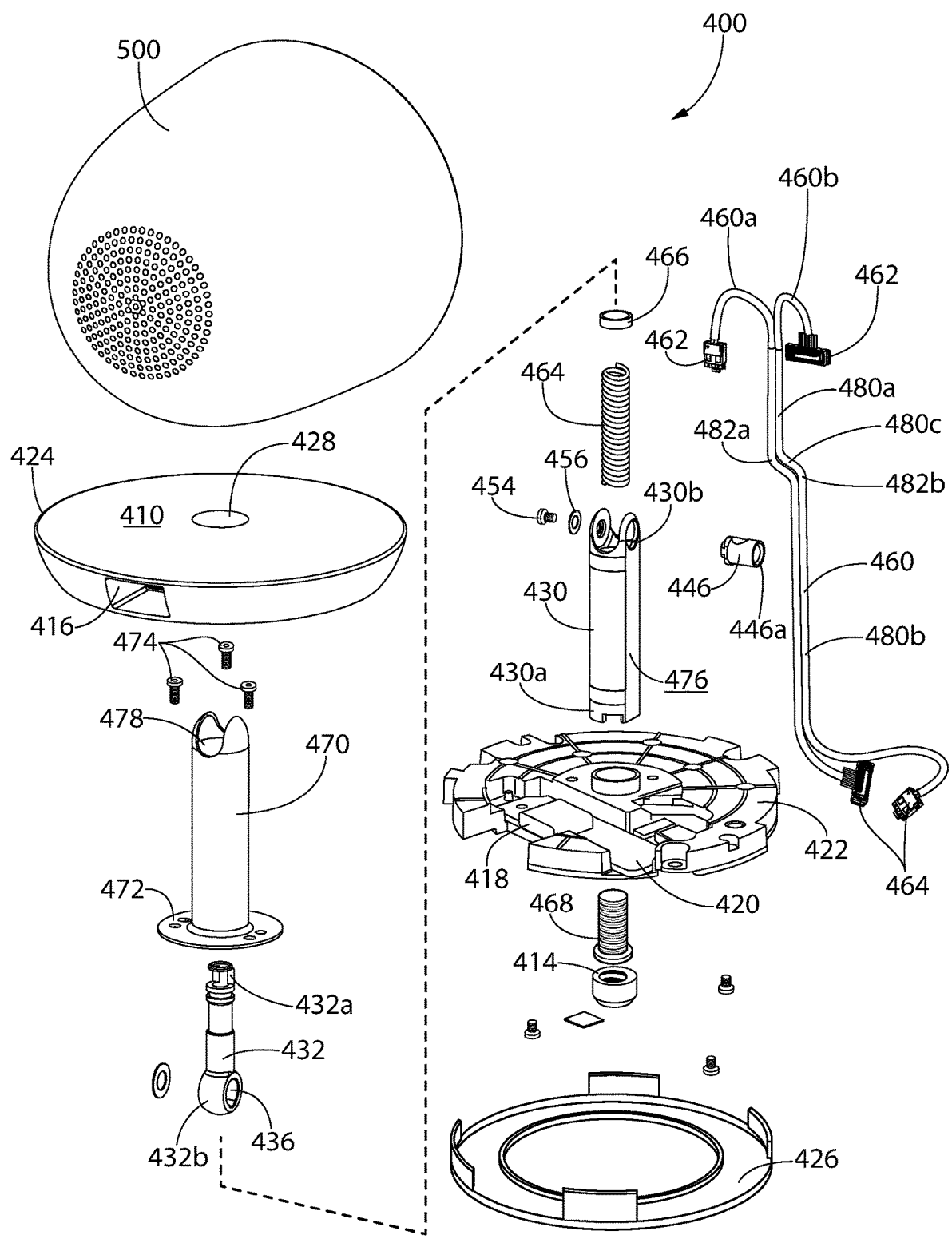
FIG. 7 is an exploded perspective view of the system of FIG. 4A, in accordance with some implementations.
Figure 8B:
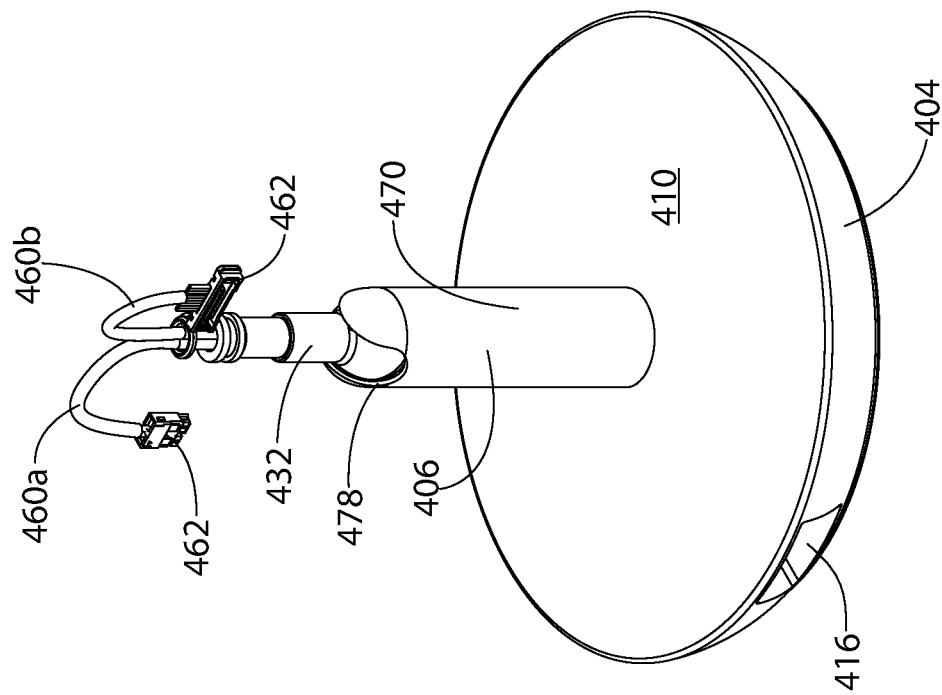
FIG. 8B is a rear perspective view of the stand assembly of FIG. 8A, in accordance with some implementations.
Figure 8A:
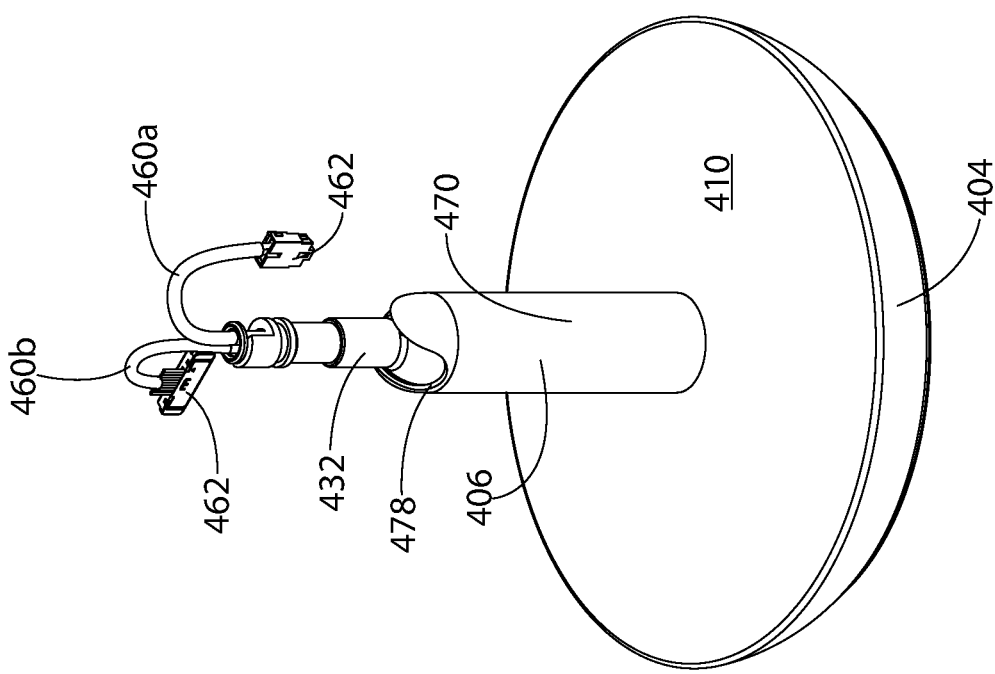
FIG. 8A is a front perspective view of a stand assembly with cables for the system, in accordance with some implementations.
Figure 8D:
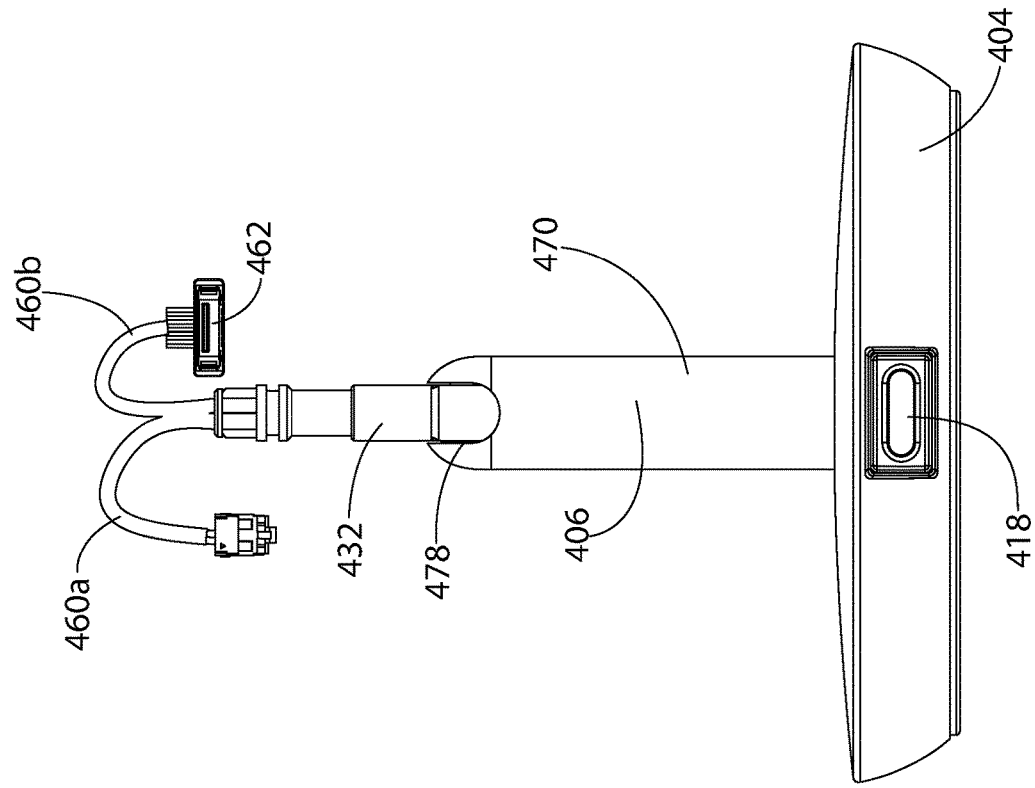
FIG. 8D is a rear elevational view of the stand assembly of FIG. 8A, in accordance with some implementations.
Figure 8C:
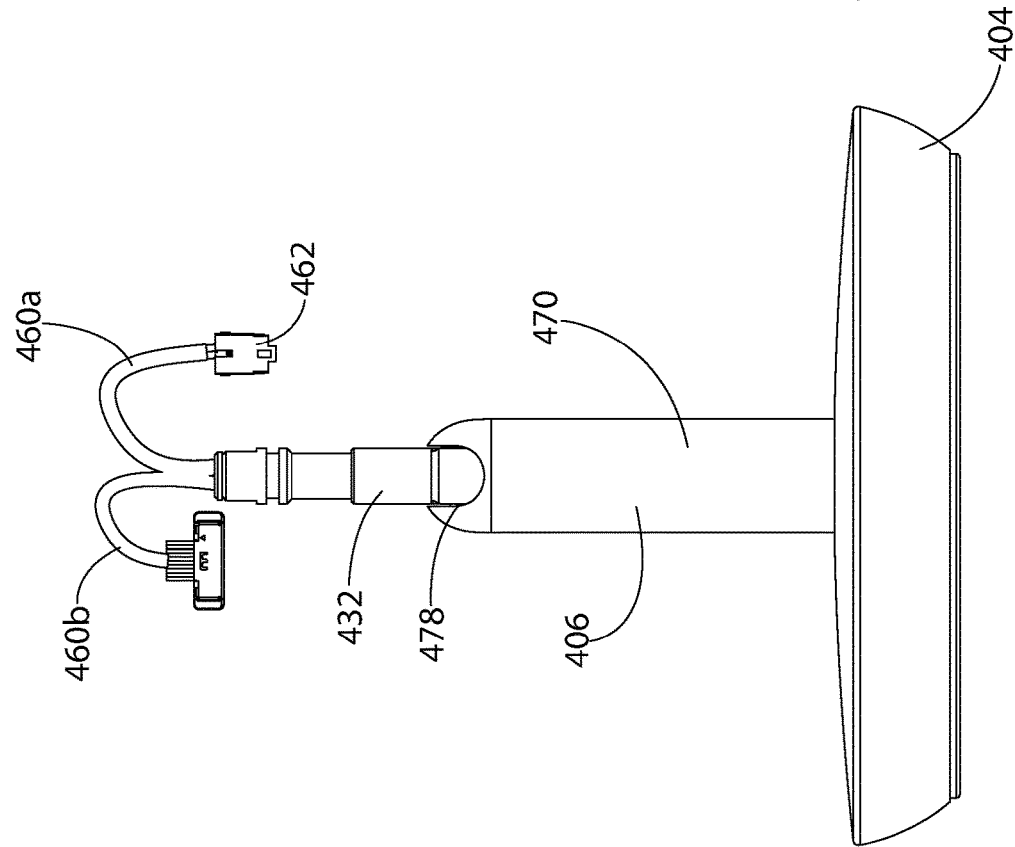
FIG. 8C is a front elevational view of the stand assembly of FIG. 8A, in accordance with some implementations.
Figure 9B:
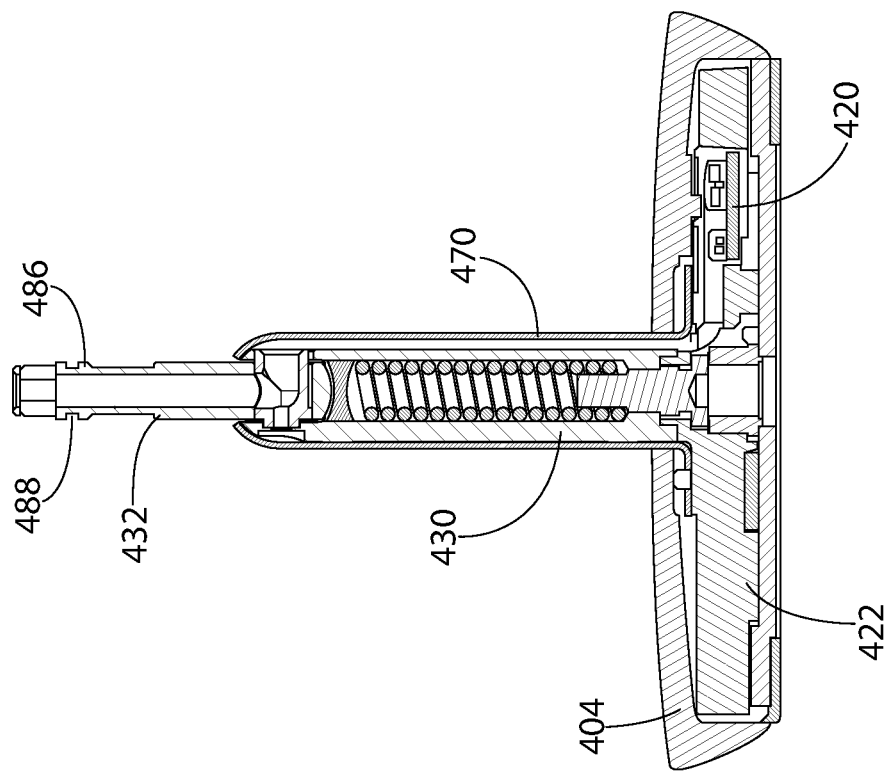
FIG. 9B is a cross-sectional view of the stand assembly taken along the plane designated by line 9B-9B of FIG. 9A.
Figure 9A:
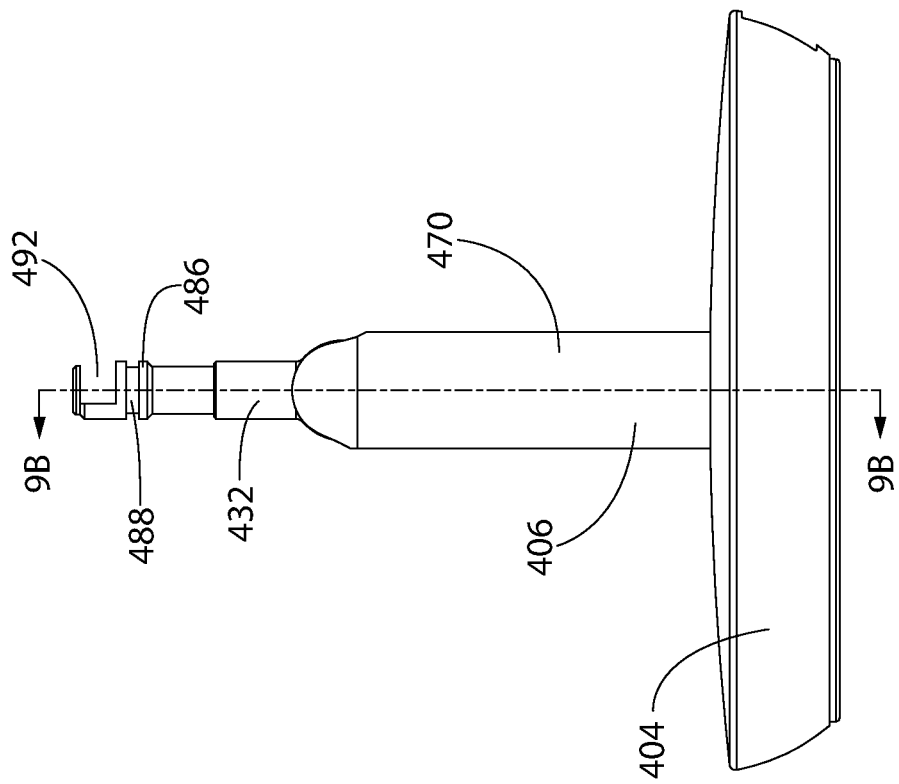
FIG. 9A is a left side view of the stand assembly of FIG. 8A with the cables removed, in accordance with some implementations.

Base portion 404 in some implementations further houses electronic circuitry which is in electronic communication with and configured to receive signals from and/or transmit signals to the electronic connector 418 of port 416. In some implementations, electronic circuitry may be provided on one or more printed circuit boards (PCBs) 420 which are disposed within base portion 404 and housed between bottom surface 408 and top surface 410. In some implementations, electronic connector 418 may be positioned on the one or more PCBs 420 in base portion 404. In some implementations, the one or more PCBs 420 includes a reset button or switch which is accessible via reset aperture 498 in base portion 404 for resetting system 400. In some implementations, the one or more PCBs 420 includes a power converter (e.g., a buck converter or DC-to-DC step down converter). In some implementations, a high voltage is input into system 400 from plug 602 and cable 604, and the power converter is configured to step down the high input voltage. In some implementations, system 400 includes both low and high voltage lines connecting the one or more PCBs 420 with the electronic device in head portion 500. In some implementations, PCBs 420 may be secured to a foundation 422 which is disposed within base portion 404. Foundation 422, in some implementations, is constructed from a solid, dense material, for example, metal or metal alloy, to provide weight to base portion 404 and to increase the stability of system 400 from tipping over by lowering the overall center of mass of system 400. In some implementations, base portion 404 has a first center of mass and head portion 500 has a second center of mass, and the first and second centers of mass are engineered to protect system 400 from tipping when the neck portion 432 rotates within the first full range of rotation of the first rotational degree of freedom. In some implementations, foundation 422 is constructed from zinc or a zinc alloy which may be shaped by casting (e.g., die casting). In some implementations, foundation 422 may include one or more prefabricated slots or cavities which are sized and shaped to hold PCBs 420. Foundation 422, PCBs 420, and electronic connector 418, in some implementations, are enclosed and concealed in a base cover which forms the exterior of base portion 404. As shown in FIGS. 6 and 7, in some implementations, the base cover includes a top portion 424 which includes top surface 410 and a bottom portion 426 which includes bottom surface 408. In some implementations, top portion 424 further includes an open cavity which defines port 416 and provides access to electronic connector 418 positioned within base portion 404. In some implementations foundation 422 and the other internal components of base portion 404 are sandwiched between top portion 424 and bottom portion 426 of the base cover. Top portion 424 and bottom portion 426, in some implementations, may be made from metal, rigid plastic, or other sturdy materials.

In further implementations, stem portion 406 is secured to foundation 422 of base portion 404 and extends through top portion 424 of the base cover. In some implementations, top portion 424 of the base cover includes a hole 428 which is sized to allow stem portion 406 to pass through. Hole 428 may be positioned at or proximate the center of top surface 410 according to some implementations. In some implementations, stem portion 406 includes a spine portion 430 secured to base portion 404 and a neck portion 432 pivotally connected to spine portion 430. As described above, in some implementations head portion 500 is rotatably connected to neck portion 432. In some implementations, head portion 500 is rotatably coupled to a first end 432a of neck portion 432a, and spine portion 430 is rotatably coupled to a second end 432b of neck portion 432. Spine portion 430 and/or neck portion 432 may be constructed from metal or metal alloy, for example, stainless steel, according to some implementations. In some implementations, spine portion 430 is rigidly fixed relative to foundation 422 and extends through hole 428 in top portion 424 and away from base portion 404 along an axis A4 that is generally perpendicular to bottom surface 408. In some implementations, spine portion 430 includes an elongate body having a first end 430a secured to foundation 422 and a second end 430b opposite of first end 430a connected to neck portion 432. In some implementations, second end 430b includes a pair of opposing flanges 434a, 434b which defines a space therebetween for receiving second end 432b of neck portion 432. In some implementations, neck portion 432 is configured to pivot with respect to spine portion 430 about axis A1 (FIG. 4A) that passes through flanges 434a, 434b and second end 432b of neck portion 432.

With reference to FIGS. 11A-11F, in some implementations, neck portion 432 is a tubular structure which defines a channel or lumen extending from a first opening 436 on a first lateral side of second end 432a of neck portion 432 to a second opening 438 at a first end 432a of neck portion 432. Neck portion 432 may thus define an L-shaped channel or lumen according to some such implementations. In some implementations, neck portion 432 may include a third opening 440 on a second lateral side of second end 432b which is opposite first opening 436. In some implementations, third opening 440 may have a different size and/or shape than first opening 436. In some such implementations, neck portion 432 defines a T-shaped channel or lumen. In some implementations, first opening 436 is configured to align with an opening 442 that extends through flange 434a when neck portion 432 is connected to spine portion 430. In some implementations, third opening 440 is configured to align with an opening 444 that extends through flange 434b when neck portion 432 is connected to spine portion 430. In some implementations, opening 444 has a smaller diameter than opening 442.

In some implementations, neck portion 432 is coupled to spine portion 430 by a joint structure that is configured to provide a first rotational degree of freedom of neck portion 432 with respect to the spine portion 430. In some implementations, the joint structure forms a hinge joint between neck portion 432 and spine portion 430. In some implementations, the first rotational degree of freedom allows neck portion 432 to tilt in the forward-backward direction with respect to spine portion 430 and, in turn, permits head portion 500 to tilt forward or backward with respect to base portion 404. In some implementations, neck portion 432 is configured to rotate a total of about 135 degrees to about 180 degrees with respect to spine portion 430. In some implementations, neck portion 432 is configured to rotate a total of about 140 degrees to about 180 degrees with respect to spine portion 430. In some implementations, neck portion 432 is configured to rotate a total of about 145 degrees to about 180 degrees with respect to spine portion 430. In some implementations, neck portion 432 is configured to rotate a total of about 150 degrees to about 180 degrees with respect to spine portion 430. In some implementations, neck portion 432 is configured to rotate a total of about 155 degrees to about 180 degrees with respect to spine portion 430. In some implementations, neck portion 432 is configured to rotate a total of about 160 degrees to about 180 degrees with respect to spine portion 430. In some implementations, neck portion 432 is configured to rotate a total of about 165 degrees to about 180 degrees with respect to spine portion 430. In some implementations, neck portion 432 is configured to rotate a total of about 170 degrees to about 180 degrees with respect to spine portion 430. In some implementations, neck portion 432 is configured to rotate a total of about 175 degrees to about 180 degrees with respect to spine portion 430. In some implementations, neck portion 432 is configured to rotate a total of at least 160 degrees and less than 180 degrees with respect to spine portion 430. In some implementations, neck portion 432 is configured to rotate a total of at least 170 degrees and less than 180 degrees with respect to spine portion 430. In some implementations, neck portion 432 is able to tilt backward with respect to spine portion 430 to a greater extent than neck portion 432 is able to tilt forward, for example up to 80 degrees in a forward direction and more than 80 degrees in a backward direction. In some implementations, the joint structure includes a first joint sub-structure located at the second end 432b of the neck portion, a second joint sub-structure located at second end 430b of the spine portion, and a third joint sub-structure that couples the first and second joint sub-structures, the first, second and third sub-structures being distinct from each other. In some implementations, the joint structure includes a pivot 446 that is configured to connect second end 432b of neck portion 432 with spine portion 430. In some implementations, pivot 446 is configured to rotate with respect to spine portion 430. In some implementations, pivot 446 is sized to be received at least partially within second end 432b of neck portion 432 and between flanges 434a and 434b of spine portion 430. In some implementations, pivot 446 is sized to be received through opening 442 of flange 434a and first opening 436 of neck portion 432. As best shown in the FIGS. 7 and 11D, in some implementations pivot 446 includes a hollow cylindrical body having an open first end 446a. In some implementations, pivot 446 further includes a second end 446b having a stepped feature 448 which is shaped and configured to align with and fit within third opening 440 in neck portion 432 when pivot 446 is received within second end 432b of neck portion 432. In some implementations, stepped feature 448 includes a size and shape that corresponds with the size and shape of third opening 440. In some implementations, positioning of stepped feature 448 within third opening 440 prevents rotation of pivot 446 with respect to neck portion 432. In further implementations, stepped feature 448 includes a further projection 450 which is sized and shaped to extend out of third opening 440 and fit within opening 442 of flange 434b of spine portion 430. Projection 450, in some implementations, includes a hole 452 for receiving a fastener 454 of the joint structure (FIG. 7). Fastener 454 may pass through opening 442 of flange 434b and into hole 452 according to some implementations. Fastener 454 in some implementations is a pin, bolt, rivet, screw, or the like. In some implementations, opening 442 of flange 434b may be threaded and configured to receive fastener 454, which may be a screw having corresponding threads. In some implementations, the joint structure further includes a washer 456 positioned between fastener 454 and flange 434b.

In some implementations, pivot 446 further includes an opening 458 positioned on a wall of the cylindrical body. Opening 458 may face a direction which is perpendicular to a direction that open first end 446a faces in some implementations. In some implementations, pivot 446 defines an internal passageway from opening 458 to open first end 446a. In some implementations, when pivot 446 is received within second end 432b of neck portion 432, the internal passageway defined by pivot 446 is contiguous with the channel or lumen defined by neck portion 432. In some implementations, when pivot 446 is positioned within second end 432b of neck portion 432, open first end 446a is coaxial with first opening 436 of neck portion 432, and opening 458 of pivot 446 is coaxial with second opening 438 of neck portion 432.

In some implementations, a resistance force is applied which must be overcome in order to pivot neck portion 432 with respect to spine portion 430 to tilt head portion 500 forward or backward with respect to base portion 404. In some implementations, the resistance force is consistent or substantially consistent throughout the range of motion of neck portion 432 with respect to spine portion 430. In some implementations, the resistance force is sufficient enough such that the combined weight of head portion 500 and neck portion 432 is insufficient by itself to cause neck portion 432 to pivot with respect to spine portion 430. In some implementations, the resistance force is further sufficient enough to prevent movement of head portion 500 and neck portion 432 with respect to spine portion 430 caused by vibration of the supporting surface. Thus, in some implementations, the resistance force allows head portion 500 and neck portion 432 to remain in a given position with respect to spine portion 430 until a sufficient additional force is applied (e.g., by the user). In some implementations, the resistance force includes one or more frictional forces applied to neck portion 432. In some implementations, stem portion 406 includes a biasing element 464, for example a spring, which applies a force against neck portion 432 to create a frictional force which must be overcome to pivot neck portion 432 with respect to spine portion 430. In some implementations, biasing element 464 is a compressed spring that is disposed within an interior of spine portion 430 and positioned to apply a force towards second end 432b of neck portion 432. In some implementations, biasing element 464 applies a force against an intermediate component 466 which in turn contacts and abuts against second end 432b of neck portion 432. In some implementations, intermediate component 466 is a bushing or washer disposed within spine portion 430 and positioned between biasing element 464 and neck portion 432. In some implementations, second end 432b includes a curved exterior surface configured to abut and rotate against intermediate component 466. The curved exterior surface of second end 432b may be, for example, a cylindrical or spherically curved surface according to some implementations. In some implementations, biasing element 464 may be compressed within spine portion 430 by a screw 468 inserted into first end 430a of spine portion 430, as shown in FIG. 6. In some such implementations, screw 468 is inserted through a hole in foundation 422 of base portion 404 and is further inserted into first end 430a of spine portion 430, which may be provided with a threaded opening sized to receive screw 468. As screw 468 is driven into spine portion 430, screw 468 displaces biasing element 464 and compresses biasing element 464 housed within the interior of spine portion 430. In some implementations, spine portion 430 is secured to foundation 422 by screw 468. In further implementations, the resistance force may additional include a frictional force produced between flanges 434a, 434b and second end 432b of neck portion 432. In some implementations, fastener 454 is configured to tighten the engagement between flanges 434a, 434b and second end 432b of neck portion 432 to create lateral tension and provide a frictional force to further resist movement between neck portion 432 and spine portion 430.

Figure 14:
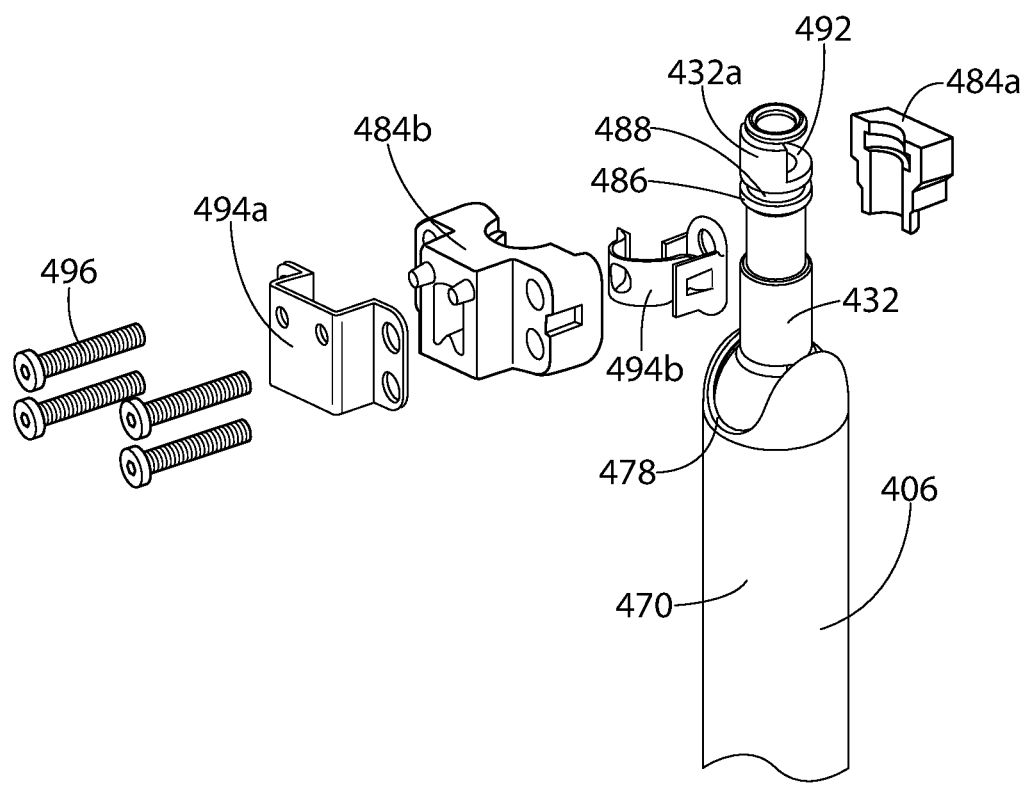
FIG. 14 is an exploded view of a clamping mechanism for attaching the electronic device to the neck portion of a stand assembly, in accordance with some implementations.

In some implementations, neck portion 432 is configured to hold head portion 500. As described herein, head portion 500 in some implementations is additionally configured to rotate with respect to neck portion 432. Referring again to FIG. 4A, in some implementations, axis A2 represents a long central axis of neck portion 432, and head portion 500 is configured to twist or rotate about axis A2 in a side-to-side motion ("yaw"). In some implementations, neck portion 432 is configured to couple with head portion 500 and allow rotation of head portion 500 about neck portion 432. In some implementations, head portion 500 is able to rotate at least 90 degrees in a first direction and at least 90 degrees in a second direction from a nominal position with respect to neck portion 432 for a total range of motion of at least 180 degrees. In some implementations, rotation of head portion 500 about neck portion 432 may be limited to less than 360 degrees, e.g., to no more than 180 degrees. In some implementations, first end 432a is received within housing 502 of head portion 500 and neck portion 432 engages with a component of head portion 500 to form a revolute joint. Referring to FIG. 14, in some implementations head portion 500 includes a mount having a clamping mechanism which is configured to surround and rotate about neck portion 432. In some implementations, the clamping mechanism is completely concealed within housing 502 of head portion 500. In some implementations, the clamping mechanism is configured to be secured around neck portion 432 and prevent head portion 500 from separating from neck portion 432. In some implementations, the clamping mechanism is a component of the electronic device of head portion 500.

In some implementations, the clamping mechanism includes a first clamp member 484a and a second clamp member 484b which are configured to engage with and rotate against a section of neck portion 432. In some implementations, first and second clamp members 484a, 484b are configured to be secured around a section of neck portion 432 between first end 432a and second end 432b of neck portion 432. In some implementations, neck portion 432 includes a circumferential collar 486 and/or a circumferential groove 488, and first and second clamp members 484a, 484b include corresponding surface features configured to mate with and rotate around the circumferential collar 486 and/or a circumferential groove 488. In some implementations, first and/or second clamp members 484a, 484b include a lip or rib positioned and configured to fit within groove 488 to prevent neck portion 432 from being pulled out of head portion 500 (e.g., along axis A2). In some implementations, the lip or rib is configured to slide within groove 488 when head portion 500 rotates about neck portion 432 (e.g., about axis A2). Circumferential groove 488 may be disposed between circumferential collar 486 and first end 432a of neck portion 432 according to some implementations. In some implementations, the clamping mechanism further includes an outer bracket 494a which may be configured to fit around an exterior portion of first and/or second clamp members 484a, 484b, and one or more fasteners 496 configured to be received through bracket 494*a* and first and/or second clamp members 484*a*, 484*b*. The one or more fasteners 496 may be configured to tighten first and/or second clamp members 484*a*, 484*b* against neck portion 432. In some implementations, outer bracket 494*a* is configured to distribute the clamping force form fasteners 496 on first and/or second clamp members 484*a*, 484*b*. In some implementations, an electrical grounding element may be positioned to contact neck portion 432 and internal metallic components (e.g., metal chassis) inside housing 502 of head portion 500. In some implementations, the clamping mechanism includes an inner bracket 494*b* which is sized and configured to fit, at least partially, between first and/or second clamp members 484*a*, 484*b* and neck portion 432. In some implementations, inner bracket 494*b* is a metallic bracket that contacts neck portion 432 and a metallic component (e.g., metal chassis) inside head portion 500 and is configured to serve as an electrical grounding element.

In some implementations, the clamping mechanism may be configured to tightly engage neck portion 432 such that a sufficient force (e.g., applied by the user) is needed to overcome a frictional force between the clamping mechanism and neck portion 432 to rotate head portion 500 with respect to neck portion 432. In some implementations, the frictional force creates a substantially consistent resistance between the clamping mechanism and neck portion 432 throughout the entire range of motion between head portion 500 and neck portion 432. In some implementations, the sufficient force is greater than the weight of head portion 500. In some implementations, head portion 500 may include a limiting feature which engages with neck portion 432 to limit the rotational range of motion between head portion 500 and neck portion 432. In some implementations, neck portion 432 includes a notch or slot and head portion 500 includes one or more rotation stops. In some implementations, the notch or slot and the one or more rotation stops mate with each other and are configured to define the second full range of rotation when the head portion 500 rotates with respect to the neck portion 432. In some implementations, head portion 500 includes a rotation stop, for example, pin 490 (FIG. 6) which is received within a slot 492 provided on neck portion 432. In some implementations, slot 492 may be positioned on a side of first end 432*a* of neck portion 432. In some implementations, as head portion 500 is rotated or twisted about neck portion 432 (e.g., rotated about axis A2), pin 490 translates within slot 492. Once pin 490 reaches and is blocked by an end of slot 492, further rotation of head portion 500 with respect to neck portion 432 is prevented. In some implementations, the size of slot 492 may be selected to limit the range of motion of head portion 500 with respect to neck portion 432. In some implementations, head portion 500 is configured to rotate about neck portion 432 about the same number of degrees that slot 492 extends around the circumference of neck portion 432. In some implementations, head portion 500 is configured to rotate about neck portion 432 less than the number of degrees that slot 492 extends around the circumference of neck portion 432. In some implementations, slot 492 extends less than 360 degrees around the circumference of neck portion 432. In some implementations, slot 492 extends between 180 degrees and 360 degrees around the circumference of neck portion 432. In some implementations, slot 492 extends at least 180 degrees around the circumference of neck portion 432. In some implementations, slot 492 extends less than 180 degrees around the circumference of neck portion 432. In some implementations, pin 490 may be positioned at a midway point of slot 492 when head portion 500 is in forward facing nominal position with respect to base portion 404 (FIG. 5B). In some implementations, head portion 500 is able to rotate an equal number of degrees in each direction away from a forward facing nominal position (e.g., plus or minus 90 degrees). It should be appreciated that the positions of pin 490 and slot 492 may be switched according to other implementations such that pin 490 is fixed to neck portion 432 and slot 492 is provided on a separate component of head portion 500.

As shown in FIGS. 8A-9B and 13A-13B, in further implementations stem portion 406 includes a stem cover 470 which is sized and shaped to surround and cover at least spine portion 430. In some implementations, stem cover 470 includes a hollow cylindrical body having a lumen that is sized and configured to receive spine portion 430. In some implementations, stem cover 470 further covers a portion of neck portion 432, for example, second end 432*b* of neck portion 432. Stem cover 470, in some implementations, may be fabricated from metal, metal alloy, or other sturdy material and helps to provide physical protection to spine portion 430 and other internal components (e.g., biasing element 464, wires housed in stem portion 406, etc.). In some implementations, stem cover 470 is sized and configured to conceal spine portion 430 and other internal components (e.g., wires housed in stem portion 406) from view.

In some implementations, stem cover 470 is mechanically coupled to base portion 404 independently of spine portion 430. In some implementations, stem cover 470 includes a hollow cylindrical body having a flange 472 at a first end. In some implementations, flange 472 is configured to be mechanically fastened onto foundation 422, for example, using one or more fasteners such as screws 474. In some implementations, a gap may exist between a portion of flange 472 and foundation 422 to provide clearance for one or more wires or other components within base portion 404. In some implementations, hole 428 in top portion 424 of the base cover is sized to allow passage of stem cover 470. In further implementations, stem cover 470 includes a cutout 478 at a second end opposite the first end and flange 472 to provide clearance for neck portion 432 throughout the range of motion (forward-backward tilting) of neck portion 432 with respect to spine portion 430. In some implementations, the range of motion of neck portion 432 with respect to spine portion 430 may be limited by the size of cutout 478. For example, in some implementations, neck portion 432 is able to pivot with respect to neck portion 430 until neck portion 432 comes into contact with and is blocked by an edge of cutout 478. In some such implementations, the size and shape of cutout 478 may be selected to provide a predetermined range of motion between neck portion 432 and spine portion 430.

In some implementations, portions of stem cover 470 at the second end are further shaped and size to cover and conceal flanges 434*a*, 434*b* of spine portion 430. In some implementations, a length of stem cover 470 from its first end to its second end is substantially the same as a length of spine portion 430. In some implementations, stem cover 470 is made from a single piece of metal or metal alloy. In some implementations, stem cover 470 is fabricated from a single sheet of metal or metal alloy (e.g., SPCE steel) which is shaped using a deep-drawing process. In some implementations, the deep-drawing process allows for flange 472 and the cylindrical body of stem cover 470 to be fabricated from a single sheet of metal while producing the desired aspect ratio. In some implementations, the stem cover is made of a single piece of material and has an aspect ratio that exceeds a length to width aspect ratio threshold (e.g., at least 3:1, at least 4:1, at least 5:1). In some implementations, stem cover 470 has an aspect ratio of length to width (diameter) of about 3:1 to about 5:1. In some implementations, stem cover 470 has an aspect ratio of length to width (diameter) of about 4:1. The length refers to the distance between the first end and second of stem cover 470, and the width refers to the width (diameter) of the cylindrical body. In some implementations, the diameter of the cylindrical body of stem cover 470 may be about the same as or slightly smaller than the diameter of hole 428 to provide a close or tight fit between stem cover 470 and top portion 424 of the base cover.

Figure 11A:
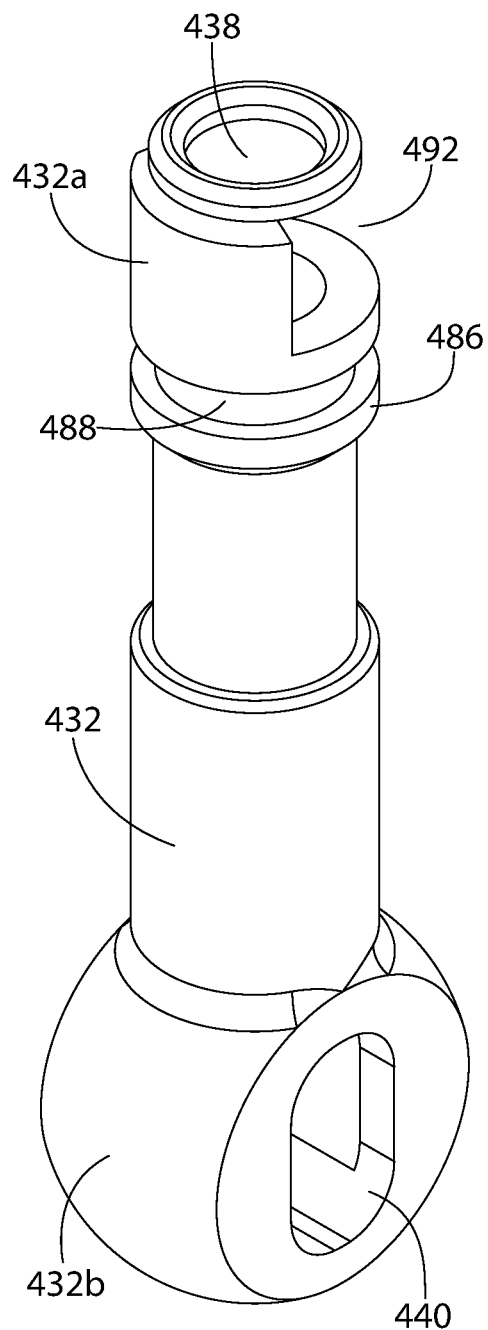
FIGS. 11A and 11B are perspective views of a neck portion of a stand assembly, in accordance with some implementations.
Figure 11B:
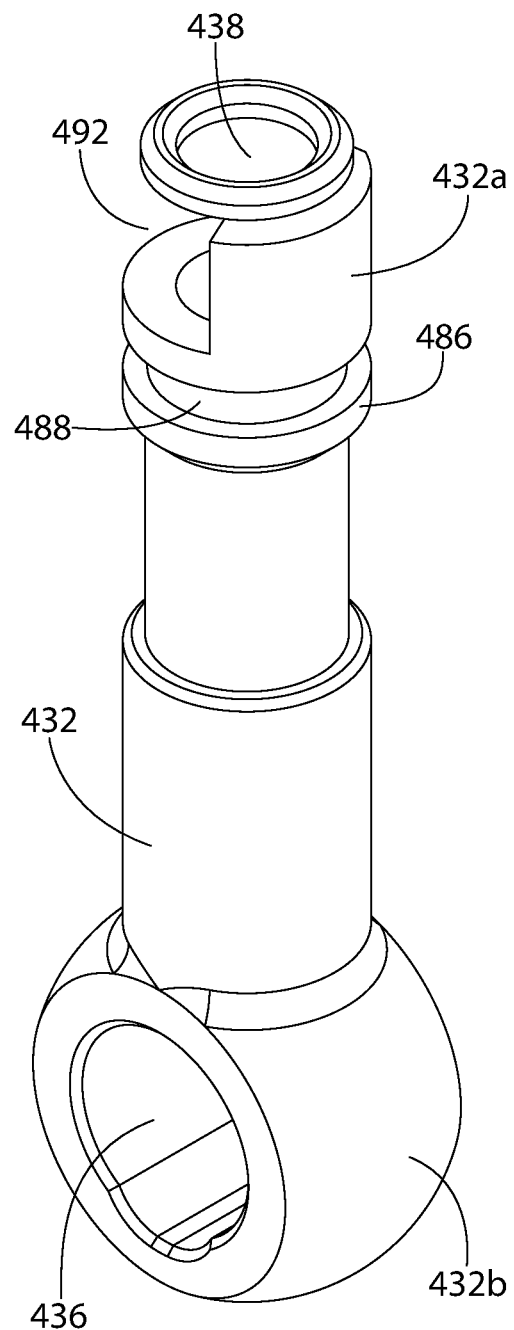
Figure 11C:
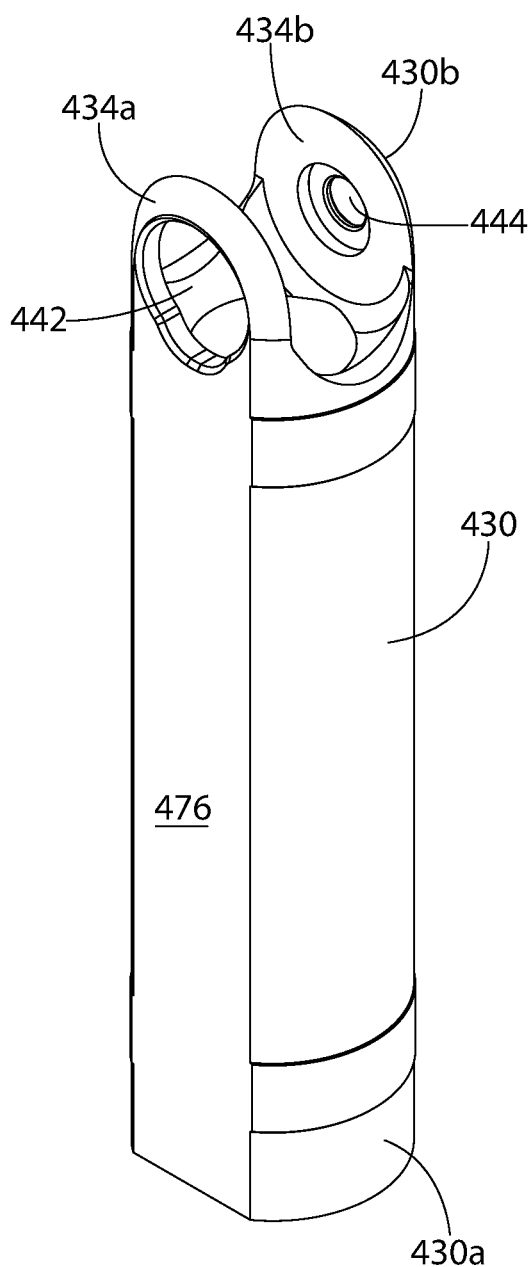
FIG. 11C is a perspective view of a spine portion of a stand assembly, in accordance with some implementations.
Figure 11D:
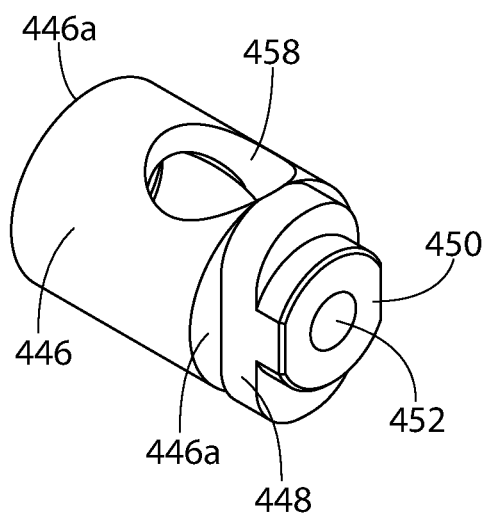
FIG. 11D is a perspective view of a joint structure of a stand assembly, in accordance with some implementations.
Figure 11E:
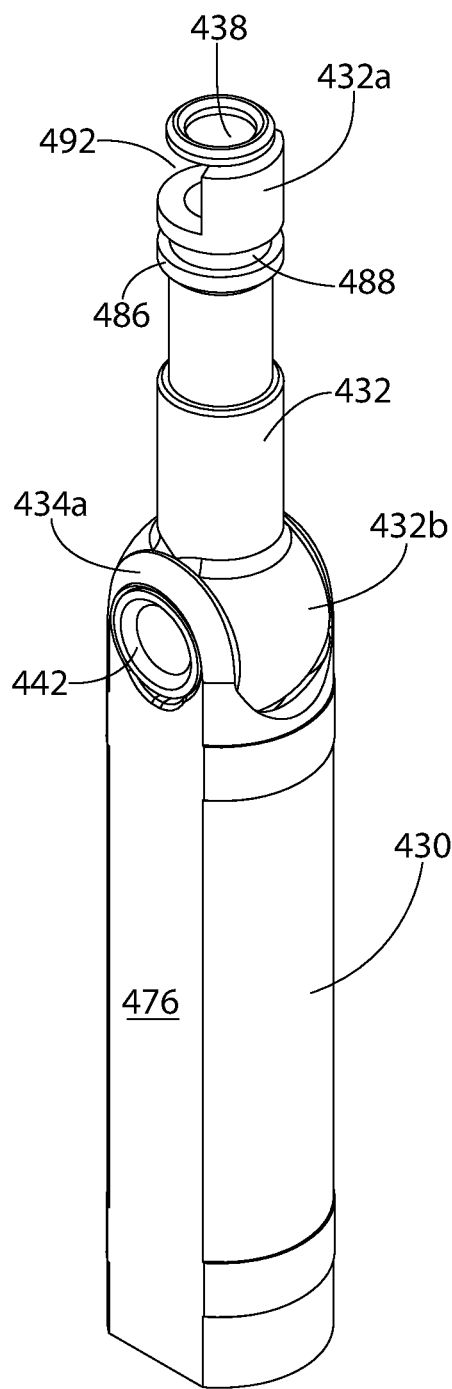
FIGS. 11E and 11F are perspective views of the assembled neck portion, spine portion, and joint structure of a stand assembly, in accordance with some implementations.
Figure 11F:
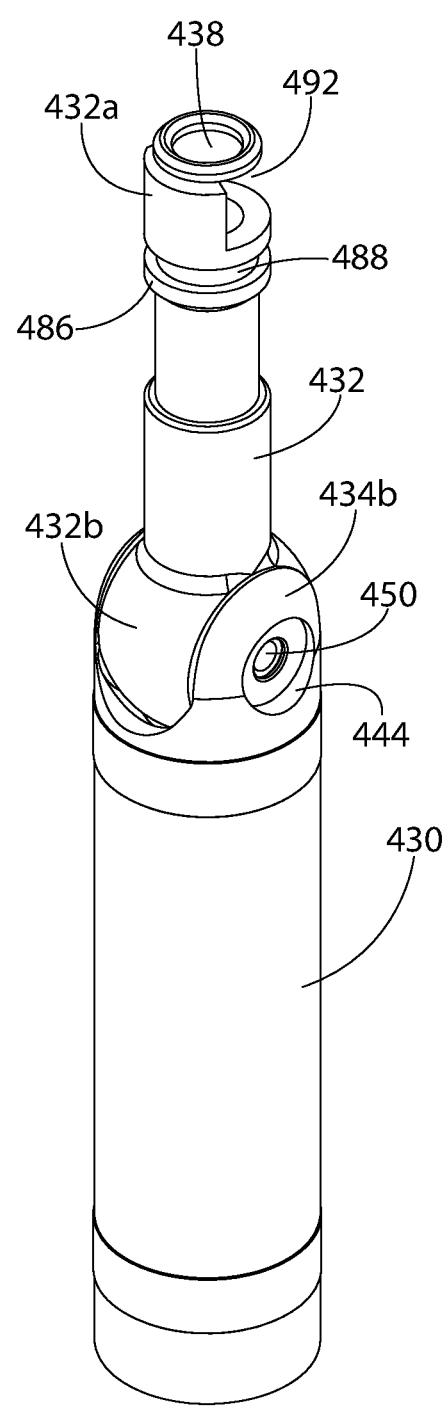

In some implementations, a clearance may be defined between stem cover 470 and an exterior surface 476 of spine portion 430. In some implementations, the clearance is sized to allow for the positioning of one or more wires, cables, or other components between exterior surface 476 and an inner surface of stem cover 470. As best seen in FIG. 11C, in some implementations, exterior surface 476 may be substantially flat or concave. In other implementations, exterior surface 476 may define a groove or channel to provide clearance for the one or more wires or cables. In some implementations, the exterior surface 476 and the clearance extends at least from opening 442 of flange 434a to first end 430a of spine portion 430. In some implementations, the clearance extends at least from opening 442 of flange 434a and into base portion 404 (e.g., between bottom surface 408 and top surface 410).

As discussed herein, in some implementations, stand assembly 402 includes one or more wires for interconnecting the electronic device (e.g., camera 118) in head portion 500 with base portion 404. In some implementations, the one or more wires electronically connect circuitry in head portion 500 with the circuitry housed within base portion 404, which in turn may be connected to an external device via plug 602 and cable 604. In some implementations, the one or more wires are sized to extend from circuitry contained in head portion 500 through neck portion 432, through pivot 446, along exterior surface 476 between spine portion 430 and stem cover 470, and into base portion 404 to circuitry contained in base portion 404. The one or more wires may include individually shielded wires in some implementations, and may be configured, for example, to transmit power and/or data. In some implementations, the one or more wires may be bundled into separate cables (e.g., data transmission cable and a power transmission cable). In some implementations the one or more wires are completely enclosed and completely concealed within base portion 404, stem portion 406, and head portion 500 of system 400. In some implementations, no portion of the one or more wires is visible to a user of system 400. In some implementations, the one or more wires are completely hidden within head portion 500 and stem assembly 402 such that no portion of the one or more wires would be visible from an exterior of system 400. In some implementations, the one or more wires include a first wire portion that is routed through an interior of neck portion 432, a second wire portion that is routed along a surface of the spine portion 430 into base portion 404, and a third wire portion that is routed though the joint structure from the surface of the spine portion 430 to the interior of the neck portion 432. In some implementations, the first and second wire portions are able to be positionally reorientated with respect to one another when neck portion 432 moves with respect to stem portion 430. In some implementations, spine portion 430 is configured to guide at least a portion of the one or more wires between neck portion 432 and base portion 404.

Referring again to FIG. 7, in some implementations, system 400 includes one or more interconnect wires 460 which may be separated into a first cable bundle 460a and a second cable bundle 460b. For example, in some implementations, first cable bundle 460a may be configured to transmit power and second cable bundle 460b may be configured to transmit data signals (e.g., video data, audio data, etc.). In some implementations, interconnect wires 460 include both low and high voltage lines. Each cable bundle 460a, 460b may have at their ends appropriate connectors (e.g., wire-to-board connectors) for electrically connecting to electronic circuitry housed in base portion 404 and head portion 500. In some implementations, interconnect wires 460 are provided with first connectors 462 at a first end for connecting to electronic circuitry of the electronic device of in head portion 500 and second connectors 464 at a second end for connecting to one or more PCBs 420 housed in base portion 404. In some implementations, cable bundles 460a, 460b may be separated from each other at their ends while a middle portion may be physically joined. In some implementations, the cable bundles 460a, 460b may be at least partially wrapped with a protective layer, for example, acetate tape.

As best shown in FIGS. 7, 10A-10B, and 12A-12C, in certain implementations the one or more interconnect wires 460 include a first wire portion 480a that is routed through an interior of neck portion 432, a second wire portion 480b that is routed along a surface of the spine portion 430 into base portion 404, and a third wire portion 430c that is routed though the joint structure from the surface of the spine portion 430 to the interior of the neck portion 432. In some implementations, each of first wire portion 480a and second wire portion 480b may be angled (e.g., obliquely or orthogonally) relative to third wire portion 480c. In some implementations, first wire portion 480a extends from connectors 462 for connecting to circuitry within head portion 500 through second opening 438 at first end 432a of neck portion 432 and into the lumen of neck portion 432. In some implementations, first wire portion 480a further extends through opening 458 and into an interior of pivot 446. First wire portion 480a, in some implementations, transitions to third wire portion 480c at a first bend 482a within pivot 446. In some implementations, first bend 482a may include a bend of about 80 degrees to about 100 degree between first wire portion 480a and third wire portion 480c, for example, about 90 degrees. In some implementations, third wire portion 480c extends out of pivot 446 through open first end 446a and through opening 442 of flange 434a of spine portion 430. In some implementations, third wire portion 480c transitions to second wire portion 480b at a second bend 482b. In some implementations, second bend 482b may include a bend of about 80 degrees to about 100 degree between third wire portion 480c and second wire portion 480b, for example, about 90 degrees. In some implementations, second wire portion 480b extends from second bend 482b along exterior surface 476 of spine portion 430 and into base portion 404. In some implementations, spine portion 430 guides the second wire portion 480b from second bend 482b to base portion 404. In some implementations, second wire portion 480b is at least partially disposed within the clearance formed between exterior surface 476 and an interior surface of stem cover 470. In some implementations, second wire portion 480b extends into base portion 404 through a gap between flange 472 of stem cover 470 and foundation 422. In further implementations, second wire portion 480b terminates at connectors 464 which are configured to couple with PCB(s) 420 housed in base portion 404 and electrically couple with electronic connector 418. In some implementations, foundation 422 may be provided with grooves or channels to direct second wire portion 480b to PCB(s) 420. In some implementations, the one or more interconnect wires 460 may have different cross-sectional shapes at different portions of the one or more interconnect wires 460. For example, in some implementations, the one or more interconnect wires 460 may be bundled at second wire portion 480b to have a generally flattened cross-section shape to better fit within the clearance between external surface 476 of spine portion 430 and stem cover 470. In further implementations, the one or more interconnect wires 460 may be bundled to have a round cross-sectional shape at first portion 480a through neck portion 432 and/or third portion 480c through pivot 446.

The positioning of first, second, and third wire portions 480a, 480b, 480c according to some implementations allows for a greater degree of motion of neck portion 432 with respect to spine portion 430. In some implementations, the positioning of first, second, and third wire portions 480a, 480b, 480c allows neck portion 432 to pivot with respect to spine portion 430 throughout its full range of motion without requiring substantial slack in the one or more wires. In some implementations, the positioning of first, second, and third wire portions 480a, 480b, 480c enables the first and second wire portions 480a, 480b to be positionally reoriented with respect to one another in accordance with the first rotational degree of freedom (e.g, when neck portion 430 pivots forward or backward with respect to spine portion 430). In some implementations, third wire portion 480c does not substantially move with respect to spine portion 430 when neck portion 432 is pivoted with respect to spine portion 430. In some implementations, first wire portion 480a bends with respect to third wire portion 480c when neck portion 432 is pivoted with respect to spine portion 430. In further implementations, the positioning of first, second, and third wire portions 480a, 480b, 480c is configured to completely conceal the one or more wires 460 such that no portion of the one or more wires 460 is visible outside of head portion 500, stem portion 406, or base portion 404.

The terminology used in the description of the various described implementations herein is for the purpose of describing particular implementations only and is not intended to be limiting. As used in the description of the various described implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The foregoing description, for purpose of explanation, has been described with reference to specific implementations. However, the illustrative discussions above are not intended to be exhaustive or to limit the scope of the claims to the precise forms disclosed. Many modifications and variations are possible in view of the above teachings. The implementations were chosen in order to best explain the principles underlying the claims and their practical applications, to thereby enable others skilled in the art to best use the implementations with various modifications as are suited to the particular uses contemplated.

What is claimed is:

1. A stand assembly for an electronic device, comprising:
    a neck portion having a first end configured to hold the electronic device and a second end arranged opposite the first end;
    a spine portion that is coupled via a joint structure to the second end of the neck portion, the joint structure configured to provide a first rotational degree of freedom of the neck portion with respect to the spine portion, the joint structure including a pair of opposing flanges that define a concave space therebetween for receiving the second end of the neck portion, the second end of the neck portion pivotally connected to the concave space via a spheroidal or cylindrical shape fixedly attached to the second end of the neck portion; and
    one or more interconnect wires including a first wire portion, a second wire portion and a third wire portion, the first wire portion being routed through an interior of the neck portion, the second wire portion being routed along a surface of the spine portion, the third wire portion being routed through an opening in one of the opposing flanges and through an opening in the spheroidal or cylindrical shape in the neck portion of the joint structure from the surface of the spine portion to the interior of the neck portion, thereby enabling the first and second wire portions to be positionally reorientated with respect to one another in accordance with the first rotational degree of freedom.

2. The stand assembly of claim 1, wherein the electronic device includes a camera.

3. The stand assembly of claim 1, wherein rotation of the neck portion at the first rotational degree of freedom has substantially consistent resistance through a first full range of rotation.

4. The stand assembly of claim 3, wherein the spine portion includes a spring coupled to the joint structure, such that when depressed, the spring applies a force on the second end of the neck portion and thereby creates at least a portion of the substantially consistent resistance associated with the first degree of freedom of rotation of the neck portion.

5. The stand assembly of claim 1, wherein the axis of rotation being substantially parallel to a planar surface of a base portion of the stand assembly that is shaped to rest against a supporting surface.

6. The stand assembly of claim 1, wherein the neck portion is configured to enable rotation of the electronic device at a second rotational degree of freedom with respect to the neck portion, the second rotational degree of freedom being associated with twisting of the electronic device with respect to a twisting axis that passes through a central axis of the neck portion, the rotation of the electronic device at the second rotational degree of freedom having substantially consistent resistance through a second full range of rotation.

7. The stand assembly of claim 6, wherein the first end of the neck portion is configured to:
    be received within a housing of the electronic device; and
    engage with a clamping mechanism configured to wrap around the neck portion to create the substantially consistent resistance associated with the second full range of rotation, the clamping mechanism being concealed within the electronic device.

8. The stand assembly of claim 6, wherein the first end includes a slot, and an interior of the electronic device includes one or more rotation stops, wherein the slot and the one or more rotation stops mate with each other and are configured to define the second full range of rotation when the electronic device rotates with respect to the neck portion.

9. The stand assembly of claim 1, wherein the one or more interconnect wires includes a plurality of discreet wires held into an interconnect wire bundle, and are configured to provide data and power to the electronic device.

10. The stand assembly of claim 1, wherein the one or more interconnect wires are configured to couple first electronic circuitry of the electronic device to second electronic circuitry disposed within a base configured to rest against a supporting surface, the base coupled to an end of the spine portion that is opposite the joint structure.

11. The stand assembly of claim 10, wherein the base further comprises an electronic connector that is exposed from a rim side of the base and inset into a body of the base, wherein the electronic connector is electrically coupled to the second wire portion of the one or more interconnect wires within the base.

12. The stand assembly of claim 11, wherein when the electronic connector is coupled to an external connector, a connection interface is formed between the electronic and external connectors and concealed within the base.

13. The stand assembly of claim 1, further comprising a stem cover configured to cover the spine portion and part of the second end of the neck portion, wherein the second wire portion of the one or more interconnect wires is concealed between the spine portion and the stem cover, wherein the third wire portion is concealed by the stem cover.

14. The stand assembly of claim 1, wherein the one or more interconnect wires are structurally invisible to a user of the stand assembly.

15. The stand assembly of claim 1, further comprising:
a base shaped to rest against a supporting surface, wherein the spine portion is fixed to and extends from the base; and
a spine cover mechanically coupled onto the base independently of the spine portion, the spine cover being configured to conceal the spine portion and at least a portion of the one or more interconnect wires and provide protection thereto.

16. A stand assembly for an electronic device, comprising:
an interconnect wire;
holding means for holding the electronic device, the holding means having a first end configured to hold the electronic and a second end arranged opposite the first end; and
guiding means for guiding the interconnect wire, the guiding means being coupled via a joint structure to the second end of the holding means, wherein the joint structure is configured to provide a first rotational degree of freedom of the holding means with respect to the guiding means, the joint structure including a pair of opposing flanges that define a concave space therebetween for receiving the second end of the holding means, the second end of the neck portion pivotally connected to the concave space via a spheroidal or cylindrical shape fixedly attached to the second end of the neck portion;
wherein the interconnect wire includes a first wire portion, a second wire portion and a third wire portion, the first wire portion being routed through an interior of the holding means, the second wire portion being routed along a surface of the guiding means, and the third wire portion being routed through the joint structure from the surface of the guiding means to the interior of the holding means via an opening in one of the opposing flanges and an opening in the spheroidal or cylindrical shape, thereby enabling the first and second wire portions to be positionally reorientated with respect to one another in accordance with the first rotational degree of freedom.

17. The stand assembly of claim 16, wherein the guiding means comprises a biasing means for applying a force against the holding means to create a substantially consistent resistance associated with the first rotational degree of freedom.

18. The stand assembly of claim 16, wherein the holding means enables the electronic device to rotate at a second rotational degree of freedom with respect to the holding means, the second rotational degree of freedom being associated with twisting of the electronic device with respect to a twisting axis that passes through a central axis of the holding means, the rotation of the electronic device at the second rotational degree of freedom having substantially consistent resistance through a second full range of rotation.

19. The stand assembly of claim 16, further comprising:
a support means for resting against a supporting surface and for housing electronic circuitry, wherein the guiding means is fixed to and extends from the support means; and
a cover means for concealing the guiding means and at least a portion of the interconnect wire, the cover means being coupled onto the base independently of the guiding means.

20. The stand assembly of claim 19, wherein the electronic device includes first electronic circuitry, the first electronic circuitry being electrically coupled to second electronic circuitry disposed within the support means via the interconnect wire.

21. The stand assembly of claim 1, wherein the spheroidal shape is a ball shape or the cylindrical shape is a barrel shape.

* * * * *